(12) United States Patent
Tamura et al.

(10) Patent No.: US 11,848,605 B2
(45) Date of Patent: Dec. 19, 2023

(54) POWER CONVERTER

(71) Applicant: Mitsubishi Electric Corporation, Tokyo (JP)

(72) Inventors: Kenichi Tamura, Tokyo (JP); Koji Nakajima, Tokyo (JP); Yoshikazu Nozuki, Tokyo (JP); Masaya Nonomura, Tokyo (JP); Taro Kimura, Tokyo (JP); Yu Kishiwada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 335 days.

(21) Appl. No.: 17/426,753

(22) PCT Filed: Sep. 13, 2019

(86) PCT No.: PCT/JP2019/036125
§ 371 (c)(1),
(2) Date: Jul. 29, 2021

(87) PCT Pub. No.: WO2020/183762
PCT Pub. Date: Sep. 17, 2020

(65) Prior Publication Data
US 2022/0103075 A1 Mar. 31, 2022

(30) Foreign Application Priority Data
Mar. 11, 2019 (JP) .................. 2019-043258

(51) Int. Cl.
*H02M 3/00* (2006.01)
*H01F 27/02* (2006.01)
(Continued)

(52) U.S. Cl.
CPC ............ *H02M 3/003* (2021.05); *H01F 27/02* (2013.01); *H01F 27/22* (2013.01); *H01F 27/263* (2013.01);
(Continued)

(58) Field of Classification Search
CPC .. H02M 3/003; H02M 3/335; H02M 3/33571; H02M 3/33573; H01F 27/02;
(Continued)

(56) References Cited

U.S. PATENT DOCUMENTS

2003/0161111 A1  8/2003  Yoshida et al.
2010/0164670 A1  7/2010  Nakahori et al.
(Continued)

FOREIGN PATENT DOCUMENTS

JP    3611548 B2    1/2005
JP    5120245 B2    1/2013
(Continued)

OTHER PUBLICATIONS

International Search Report (PCT/ISA/210) with translation and Written Opinion (PCT/ISA/237) dated Nov. 12, 2019, by the Japan Patent Office as the International Searching Authority for International Application No. PCT/JP2019/036125.

*Primary Examiner* — Thienvu V Tran
*Assistant Examiner* — Shahzeb K Ahmad
(74) *Attorney, Agent, or Firm* — BUCHANAN INGERSOLL ROONEY PC

(57) ABSTRACT

A power converter includes a circuit board, a first magnetic core, and a housing. The circuit board includes an insulating substrate and a first coil conductor. The insulating substrate includes a first side surface. The first magnetic core includes a first magnetic core member and a second magnetic core member. A first side surface of the insulating substrate is opposed to a first portion of the housing and is spaced away from the first portion of the housing. The first magnetic core member and the second magnetic core member are both thermally connected to the first portion.

18 Claims, 21 Drawing Sheets

(51) Int. Cl.
  *H01F 27/22* (2006.01)
  *H01F 30/10* (2006.01)
  *H05K 1/02* (2006.01)
  *H01F 27/26* (2006.01)
  *H01F 27/28* (2006.01)
  *H02M 3/335* (2006.01)
  *H01L 23/40* (2006.01)

(52) U.S. Cl.
  CPC ....... *H01F 27/266* (2013.01); *H01F 27/2804* (2013.01); *H01F 30/10* (2013.01); *H01L 23/40* (2013.01); *H02M 3/33573* (2021.05); *H05K 1/021* (2013.01); *H01F 2027/2819* (2013.01); *H02M 3/335* (2013.01)

(58) Field of Classification Search
  CPC ...... H01F 27/22; H01F 27/263; H01F 27/266; H01F 27/2804; H01F 2027/2819; H01F 2027/2809; H01F 30/10; H01L 23/40; H05K 1/021
  See application file for complete search history.

(56) References Cited

U.S. PATENT DOCUMENTS

| | | | |
|---|---|---|---|
| 2010/0232181 A1* | 9/2010 | Nakahori | H01F 27/2804 336/221 |
| 2014/0029324 A1* | 1/2014 | Sanae | H05K 7/209 363/141 |
| 2015/0048917 A1 | 2/2015 | Uchiyama et al. | |
| 2017/0287624 A1* | 10/2017 | Osada | H01L 23/5225 |
| 2017/0310228 A1* | 10/2017 | Nakajima | H01F 27/24 |
| 2018/0041133 A1* | 2/2018 | Yang | H01F 27/025 |
| 2019/0066906 A1 | 2/2019 | Hiratsuka et al. | |
| 2019/0110355 A1* | 4/2019 | Sato | H05K 7/205 |

FOREIGN PATENT DOCUMENTS

| | | | | |
|---|---|---|---|---|
| JP | 5751293 | B2 | 5/2015 | |
| JP | 2017093145 | A | 5/2017 | |
| JP | 2018074095 | A | 5/2018 | |
| WO | 2017187478 | A1 | 11/2017 | |
| WO | WO-2017188246 | A1 * | 11/2017 | ............. H02M 3/28 |

\* cited by examiner

… … …

POWER CONVERTER

TECHNICAL FIELD

The present invention relates to a power converter.

BACKGROUND ART

Japanese Patent No. 3611548 (PTL 1) discloses a switching power supply including a heat dissipation plate, an electrically insulating heat-transfer sheet, a magnetic component, and a printed circuit board including a coil conductor. The magnetic component includes a first core and a second core. The first core is mounted on the heat dissipation plate with the heat-transfer sheet therebetween. The second core is stacked on the first core and is disposed on the side distant from the heat dissipation plate with respect to the first core.

CITATION LIST

Patent Literature

PTL 1: Japanese Patent No. 3611548

SUMMARY OF INVENTION

Technical Problem

In the switching power supply disclosed in PTL 1, the second core is disposed on the side distant from the heat dissipation plate with respect to the first core. The second core is less sufficiently cooled than the first core. A loss in the magnetic component increases. The present invention has been made in view of the above problem, and an object thereof is to provide a power converter having improved power conversion efficiency.

Solution to Problem

A power converter of the present invention includes a circuit board, a first magnetic core, and a housing. The circuit board includes an insulating substrate and a first coil conductor. The insulating substrate includes a first main surface, a second main surface opposite to the first main surface, a first side surface, and a second side surface opposite to the first side surface. The first side surface and the second side surface each connect the first main surface to the second main surface. The first coil conductor is provided on at least one of the first main surface or the second main surface. The first magnetic core includes a first magnetic core member and a second magnetic core member. The housing accommodates the circuit board and the first magnetic core. The first coil conductor extends to surround a part of the first magnetic core. The housing includes a first portion. The first side surface of the insulating substrate is opposed to the first portion of the housing and is spaced away from the first portion of the housing. The first magnetic core member and the second magnetic core member are both thermally connected to the first portion.

Advantageous Effects of Invention

The first magnetic core member and the second magnetic core member are cooled by the first portion of the housing. The maximum temperature of the first magnetic core during operation of the power converter can be lowered. A loss in the first magnetic core can be reduced. The power conversion efficiency of the power converter can be improved.

DESCRIPTION OF EMBODIMENTS

Figure 1:
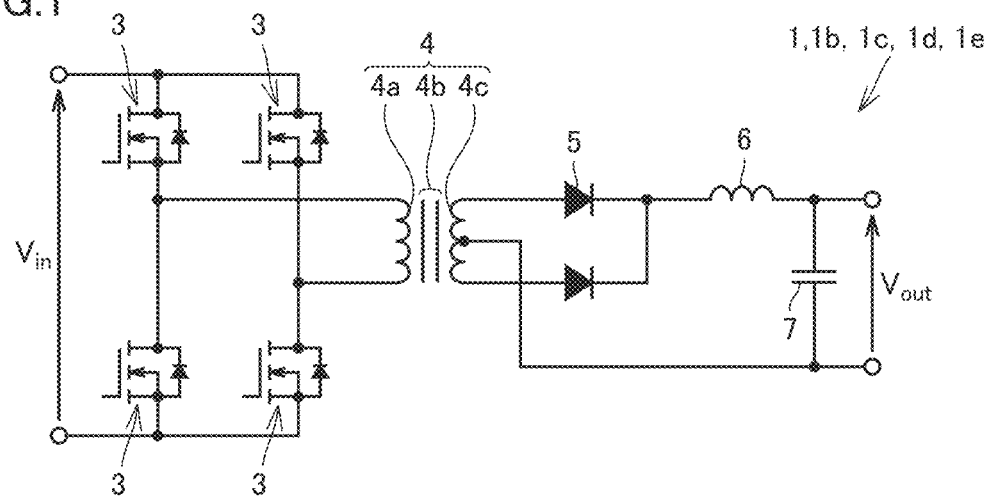
FIG. 1 is a circuit diagram of each of power converters of Embodiment 1 to Embodiment 5.

Embodiments of the present invention will be described below. Like components are designated by like reference numerals, description of which will not be repeated.

Embodiment 1

An example circuit configuration of a power converter 1 of the present embodiment will be described with reference to FIG. 1. Power converter 1 is, for example, a direct-current (DC)-DC converter. Power converter 1 converts a DC voltage Vin input to an input terminal into a DC voltage Vout and outputs DC voltage Vout from an output terminal. Power converter 1 may be mounted in, for example, an electric vehicle. Power converter 1 may convert, for example, DC voltage Vin (e.g., not less than 100 V and not greater than 300 V) output from a lithium-ion battery into DC voltage Vout (e.g., 12 to 15 V) suitable for charging a lead storage battery.

Power converter 1 includes a plurality of switching elements 3, a transformer 4, a plurality of diodes 5, a smoothing reactor 6, and a smoothing capacitor 7.

Switching elements 3 convert the input DC voltage Vin into a first alternating-current (AC) voltage and outputs the first AC voltage to transformer 4. For example, each of switching elements 3 is a metal-oxide-semiconductor-field-effect transistor (MOSFET) or an insulated gate bipolar transistor (IGBT).

Transformer 4 includes a primary coil conductor 4a, a magnetic core 4b, and a secondary coil conductor 4c. Transformer 4 converts the first AC voltage output from switching elements 3 into a second AC voltage in accordance with a ratio $N_1/N_2$ of a first winding number $N_1$ of primary coil conductor 4a to a second winding number $N_2$ of secondary coil conductor 4c. In transformer 4, primary coil conductor 4a and secondary coil conductor 4c are electrically insulated from each other. Secondary coil conductor 4c is magnetically coupled to primary coil conductor 4a with magnetic core 4b therebetween.

Diodes 5 convert the second AC voltage output from transformer 4 into a DC voltage. Smoothing reactor 6 and smoothing capacitor 7 constitute a smoothing circuit. The smoothing circuit smoothes the DC voltage converted by diodes 5. Power converter 1 outputs, from an output terminal, DC voltage Vout output from the smoothing circuit.

The configuration of power converter 1 of the present embodiment will be described with reference to FIGS. 2 to 10. Power converter 1 mainly includes a circuit board 10, a first magnetic core 8a, and a housing 9. Power converter 1 may further include a first pressing portion 16. Power converter 1 may further include a first coupling member (22a, 22b, 23a, 23b).

Figure 2:
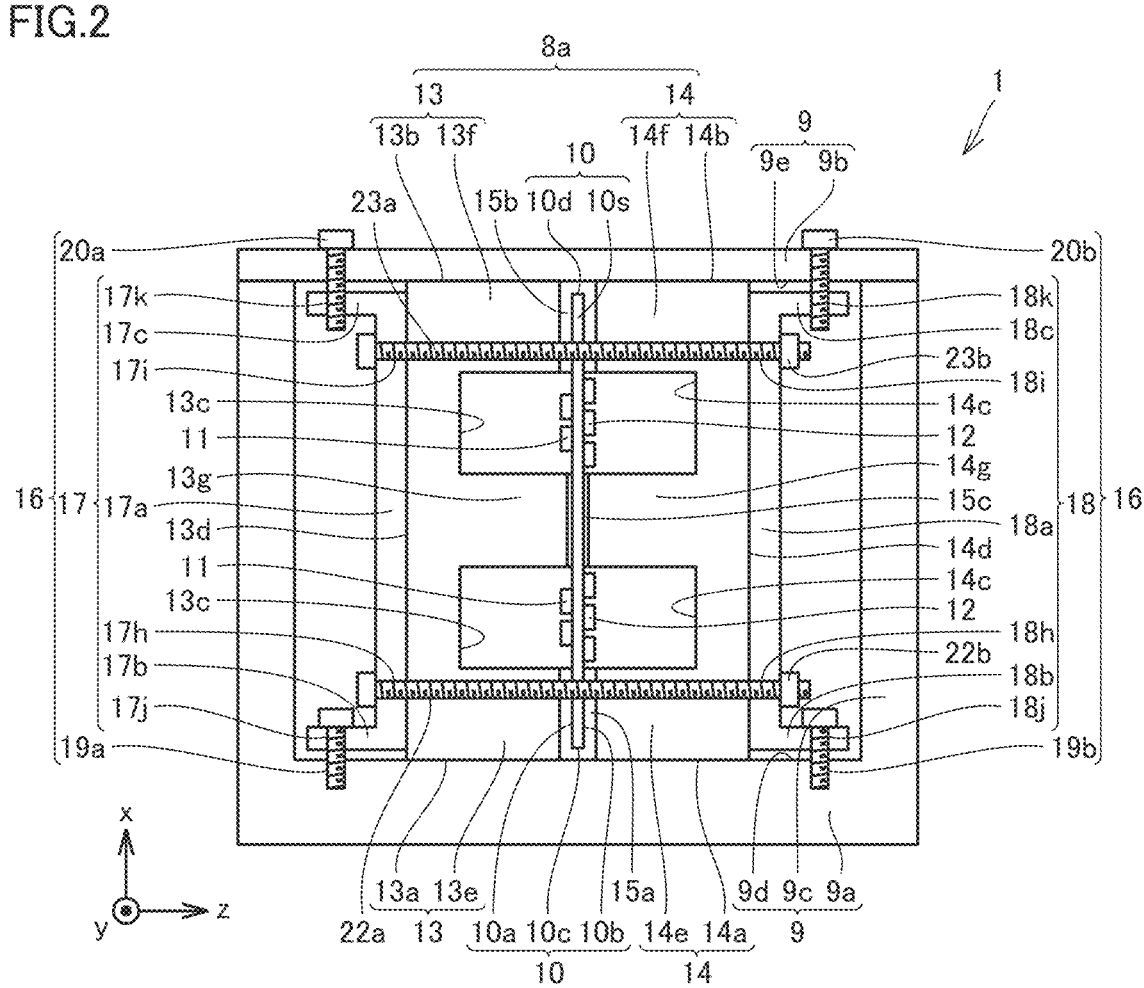
FIG. 2 is a schematic side view of an interior of a housing of the power converter of Embodiment 1.

As shown in FIG. 2, housing 9 accommodates circuit board 10 and first magnetic core 8a.

Housing 9 includes a first portion 9a. First portion 9a of housing 9 may be, for example, a bottom plate. First portion 9a has a first support surface 9d. First support surface 9d supports a first magnetic core member 13 and a second magnetic core member 14. A second portion 9b is opposed to first portion 9a. Second portion 9b of housing 9 may be, for example, a top plate. Second portion 9b has a second support surface 9e. Second support surface 9e is opposed to first support surface 9d. Second support surface 9e supports first magnetic core member 13 and second magnetic core member 14. First portion 9a may include a wall 9c. Wall 9c is provided on the peripheral edge of first portion 9a. Wall 9c may be integrated with first portion 9a. There is a small gap between wall 9c and second portion 9b.

First portion 9a may have a higher thermal conductance than second portion 9b. The thermal conductance of a member is commonly proportional to a cross section of the member (a thickness of the member). First portion 9a may have higher heat dissipation performance than second portion 9b. For example, first portion 9a and second portion 9b may be made of the same material, and first portion 9a may have a larger thickness (i.e., larger cross section) than second portion 9b.

Figure 3:
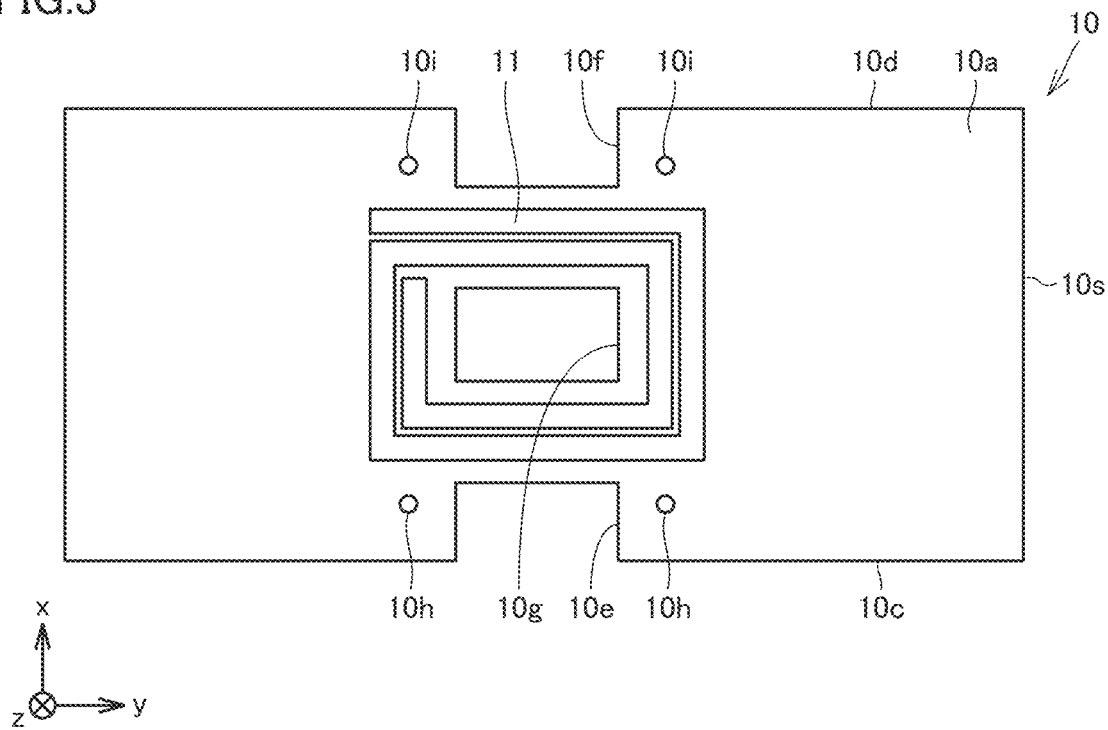
FIG. 3 is a schematic plan view of a circuit board included in the power converter of Embodiment 1.

As shown in FIGS. 2 and 3, circuit board 10 includes an insulating substrate 10s and a first coil conductor (coil conductor 11, coil conductor 12). Switching elements 3, transformer 4, diodes 5, and smoothing capacitor 7 shown in FIG. 1 may be mounted on circuit board 10. These electrical components and magnetic components are electrically connected to each other by wires (not shown) formed on circuit board 10. The first coil conductor (coil conductor 11, coil conductor 12) includes coil conductor 11 and coil conductor 12. Coil conductor 11 corresponds to primary coil conductor 4a (see FIG. 1). Coil conductor 12 corresponds to secondary coil conductor 4c (see FIG. 1). First magnetic core 8a corresponds to magnetic core 4b (see FIG. 1). First magnetic core 8a and the first coil conductor (coil conductor 11, coil conductor 12) constitute transformer 4 (see FIG. 1).

Insulating base material 10s is made of a resin material, such as glass-reinforced epoxy resin, phenolic resin, polyphenylene sulfide (PPS), or polyetheretherketone (PEEK). Insulating base material 10s may be made of a ceramic material, such as aluminum oxide ($Al_2O_3$) or aluminum nitride (AlN).

Insulating base material 10s includes a first main surface 10a, a second main surface 10b opposite to first main surface 10a, a first side surface 10c, and a second side surface 10d opposite to first side surface 10c. First main surface 10a and second main surface 10b each extend in a first direction (x direction) and a second direction (y direction) perpendicular to the first direction (x direction). First side surface 10c and second side surface 10d each connect first main surface 10a to second main surface 10b. First side surface 10c and second side surface 10d are opposed to each other in the first direction (x direction). First side surface 10c of insulating substrate 10s is opposed to first portion 9a (first support surface 9d) of housing 9 and is spaced away from first portion 9a (first support surface 9d) of housing 9. Second side surface 10d of insulating substrate 10s is opposed to second portion 9b (second support surface 9e) of housing 9 and is spaced away from second portion 9b (second support surface 9e) of housing 9.

Figure 4:
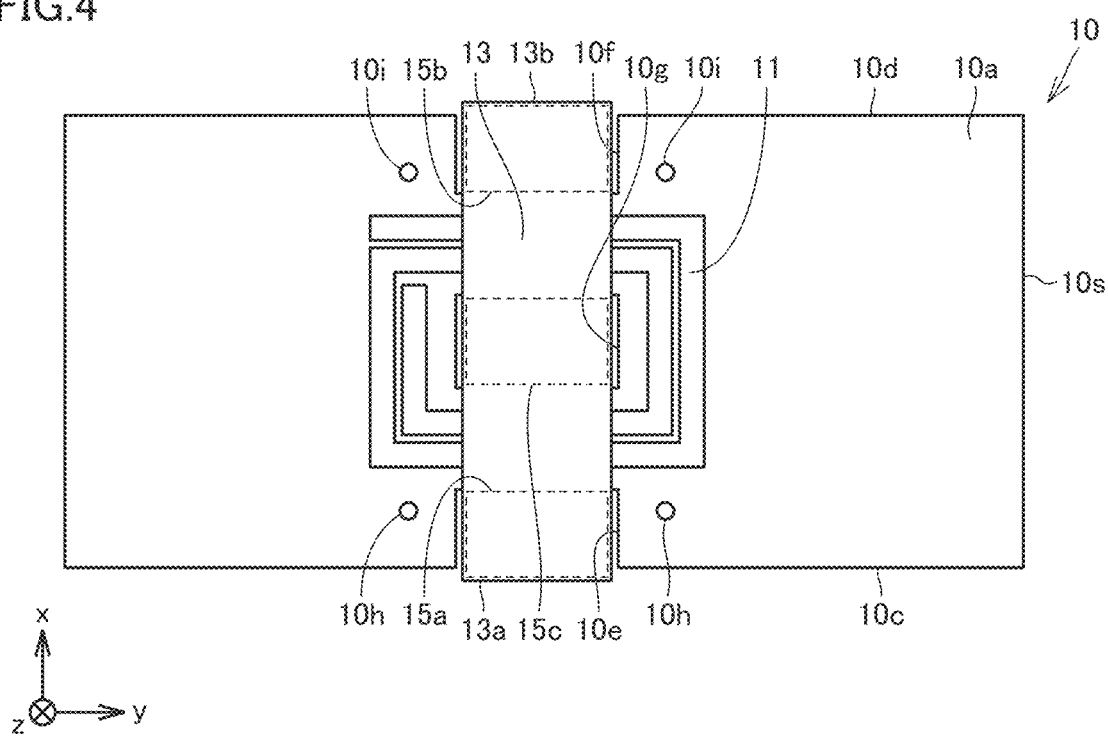
FIG. 4 is a schematic plan view of the circuit board and a first magnetic core included in the power converter of Embodiment 1.

As shown in FIGS. 3 and 4, a recess 10e is provided in first side surface 10c of insulating substrate 10s. A recess 10f is provided in second side surface 10d of insulating substrate 10s. An opening 10g is provided in insulating substrate 10s. Opening 10g is provided between recess 10e and recess 10f. Recesses 10e, 10f and opening 10g are arranged in the first direction (x direction). Holes 10h, 10i are provided in insulating substrate 10s. Holes 10h are proximate to first side surface 10c. Holes 10h are provided, for example, on the opposite sides of recess 10e in the second direction (y direction). Holes 10i are proximate to second side surface 10d. Holes 10i are provided, for example, on the opposite sides of recess 10f in the second direction (y direction).

The first coil conductor (coil conductor 11, coil conductor 12) is provided on at least one of first main surface 10a or second main surface 10b. Particularly, coil conductor 11 is provided on first main surface 10a of circuit board 10, and coil conductor 12 is provided on second main surface 10b of circuit board 10. Circuit board 10 is, for example, a double-sided circuit board. Insulating base material 10s electrically insulates coil conductor 11 from coil conductor 12. The first coil conductor (coil conductor 11, coil conductor 12) extends to surround a part of first magnetic core 8a. Specifically, coil conductor 11 extends spirally around opening 10g. Coil conductor 11 surrounds a part of first magnetic core 8a (e.g., a central leg of first magnetic core 8a). Coil conductor 12 extends spirally around opening 10g. Coil conductor 12 surrounds a part of first magnetic core 8a (e.g., the central leg of first magnetic core 8a).

A first winding number of coil conductor 11 is different from a second winding number of coil conductor 12. The first coil conductor (coil conductor 11, coil conductor 12) is made of a conducting material, such as copper (Cu), silver (Ag), gold (Au), tin (Sn), copper (Cu) alloy, nickel (Ni) alloy, gold (Au) alloy, silver (Ag) alloy, or tin (Sn) alloy. The first coil conductor (coil conductor 11, coil conductor 12) is a thin conductor layer having a thickness of not less than 1 µm and not greater than 5000 µm. A part of coil conductor 11, 12 may be covered with an insulating film (not shown) such as a solder resist.

First magnetic core 8a includes first magnetic core member 13 and second magnetic core member 14. First magnetic core member 13 and second magnetic core member 14 are separate from each other. For example, each of first magnetic core member 13 and second magnetic core member 14 is made of a silicon steel sheet, or a magnetic material such as permalloy or ferrite.

First magnetic core member 13 includes a first surface 13a, a third surface 13b opposite to first surface 13a, a fifth surface 13c facing first main surface 10a of circuit board 10, and a sixth surface 13d opposite to fifth surface 13c. First surface 13a and third surface 13b extend in the second direction (y direction) and a third direction (z direction) perpendicular to the first direction (x direction) and the second direction (y direction). First surface 13a is opposed to first portion 9a (first support surface 9d) of housing 9. Third surface 13b is opposed to second portion 9b (second support surface 9e) of housing 9. Fifth surface 13c and sixth surface 13d extend in the first direction (x direction) and the second direction (y direction). Sixth surface 13d may connect first surface 13a to third surface 13b.

Second magnetic core member 14 includes a second surface 14a, a fourth surface 14b opposite to second surface 14a, a seventh surface 14c facing second main surface 10b of circuit board 10, and an eighth surface 14d opposite to seventh surface 14c. Second surface 14a and fourth surface 14b extend in the second direction (y direction) and the third direction (z direction). Second surface 14a is opposed to first portion 9a (first support surface 9d) of housing 9. Fourth surface 14b is opposed to second portion 9b (second support surface 9e) of housing 9. Seventh surface 14c and eighth surface 14d extend in the first direction (x direction) and the second direction (y direction). Eighth surface 14d may connect second surface 14a to fourth surface 14b.

In the first direction (x direction), first surface 13a of first magnetic core member 13 and second surface 14a of second magnetic core member 14 are closer to first portion 9a of housing 9 than a first heat dissipation member 17, a second heat dissipation member 18, and first side surface 10c of circuit board 10 are to first portion 9a of housing 9. In the first direction (x direction), third surface 13b of first magnetic core member 13 and fourth surface 14b of second magnetic core member 14 are closer to second portion 9b of housing 9 than first heat dissipation member 17, second heat dissipation member 18, and second side surface 10d of circuit board 10 are to second portion 9b of housing 9. Second surface 14a of second magnetic core member 14 may be flush with first surface 13a of first magnetic core member 13. Fourth surface 14b of second magnetic core member 14 may be flush with third surface 13b of first magnetic core member 13.

First magnetic core 8a is, for example, an EE magnetic core. First magnetic core member 13 and second magnetic core member 14 each have an E-shape. Specifically, first magnetic core member 13 includes a pair of side legs 13e, 13f, and a central leg 13g. Central leg 13g is provided between the pair of side legs 13e, 13f. The pair of side legs 13e, 13f and central leg 13g are arranged in the first direction (x direction). The pair of side legs 13e, 13f and central leg 13g project from fifth surface 13c toward circuit board 10. Second magnetic core member 14 includes a pair of side legs 14e, 14f and a central leg 14g. Central leg 14g is provided between the pair of side legs 14e, 14f. The pair of side legs 14e, 14f and central leg 14g are arranged in the first direction (x direction). The pair of side legs 14e, 14f and central leg 14g project from seventh surface 14c toward circuit board 10.

First magnetic core 8a may further include nonmagnetic spacers 15a, 15b, 15c. Nonmagnetic spacer 15a is sandwiched between side leg 13e of first magnetic core member 13 and side leg 14e of second magnetic core member 14. Nonmagnetic spacer 15b is sandwiched between side leg 13f of first magnetic core member 13 and side leg 14f of second magnetic core member 14. Nonmagnetic spacer 15c is sandwiched between central leg 13g of first magnetic core member 13 and central leg 14g of second magnetic core member 14. Nonmagnetic spacers 15a, 15b, 15c are made of a material having a lower thermal conductivity than first magnetic core member 13 and second magnetic core member 14. Nonmagnetic spacers 15a, 15b, 15c are, though not particularly limited, made of polyethylene terephthalate (PET), for example.

First magnetic core 8a is positioned by circuit board 10. The pair of side legs and the central leg of first magnetic core 8a are fitted with recesses 10e, 10f and opening 10g of circuit board 10. Specifically, nonmagnetic spacer 15a is fitted with recess 10e of circuit board 10. Nonmagnetic spacer 15b is fitted with recess 10f of circuit board 10. Nonmagnetic spacer 15c is fitted with opening 10g of circuit board 10.

First magnetic core member 13 and second magnetic core member 14 are both thermally connected to first portion 9a (first support surface 9d). Specifically, first surface 13a of first magnetic core member 13 and second surface 14a of second magnetic core member 14 may be in direct contact with first portion 9a (first support surface 9d). An electrically insulating heat-transfer layer (not shown) may be interposed between first surface 13a of first magnetic core member 13 and first portion 9a (first support surface 9d) and between second surface 14a of second magnetic core member 14 and first portion 9a (first support surface 9d). The heat-transfer layer has a thermal conductivity of not less than 0.1 W/(m·K). The heat-transfer layer may have a heat conductivity of not less than 1.0 W/(m·K) or have a heat conductivity of not less than 10.0 W/(m·K). The heat-transfer layer may be, for example, a heat-transfer sheet, such as a silicone rubber sheet or a urethane rubber sheet. The heat-transfer layer may be made of, for example, silicone gel, silicone grease, or silicone adhesive.

First magnetic core member 13 and second magnetic core member 14 are both thermally connected to second portion 9b (second support surface 9e). Specifically, third surface 13b of first magnetic core member 13 and fourth surface 14b of second magnetic core member 14 may be in direct contact with second portion 9b (second support surface 9e). Third surface 13b of first magnetic core member 13 and fourth surface 14b of second magnetic core member 14 may be thermally connected to second portion 9b (second support surface 9e) with an electrically insulating heat-transfer layer (not shown) therebetween.

First pressing portion 16 presses first portion 9a toward first magnetic core member 13 and second magnetic core member 14 to thermally connect first portion 9a to first magnetic core member 13 and second magnetic core member 14 more reliably. First portion 9a may be pressed by first pressing portion 16 to be in contact with first magnetic core member 13 and second magnetic core member 14. First pressing portion 16 presses second portion 9b toward first magnetic core member 13 and second magnetic core member 14 to thermally connect second portion 9b to first magnetic core member 13 and second magnetic core member 14 more reliably. Second portion 9b may be pressed by first pressing portion 16 to be in contact with first magnetic core member 13 and second magnetic core member 14.

Particularly, first pressing portion 16 includes first heat dissipation member 17, second heat dissipation member 18, and first fastening members 19a, 19b. First pressing portion 16 may further include second fastening members 20a, 20b.

First heat dissipation member 17 is thermally connected to first magnetic core member 13. First heat dissipation member 17 may be in direct contact with first magnetic core member 13. An electrically insulating heat-transfer layer (not shown) may be interposed between first heat dissipation member 17 and first magnetic core member 13. First heat dissipation member 17 is spaced away from first portion 9a. First heat dissipation member 17 is spaced away from second portion 9b.

Figure 5:
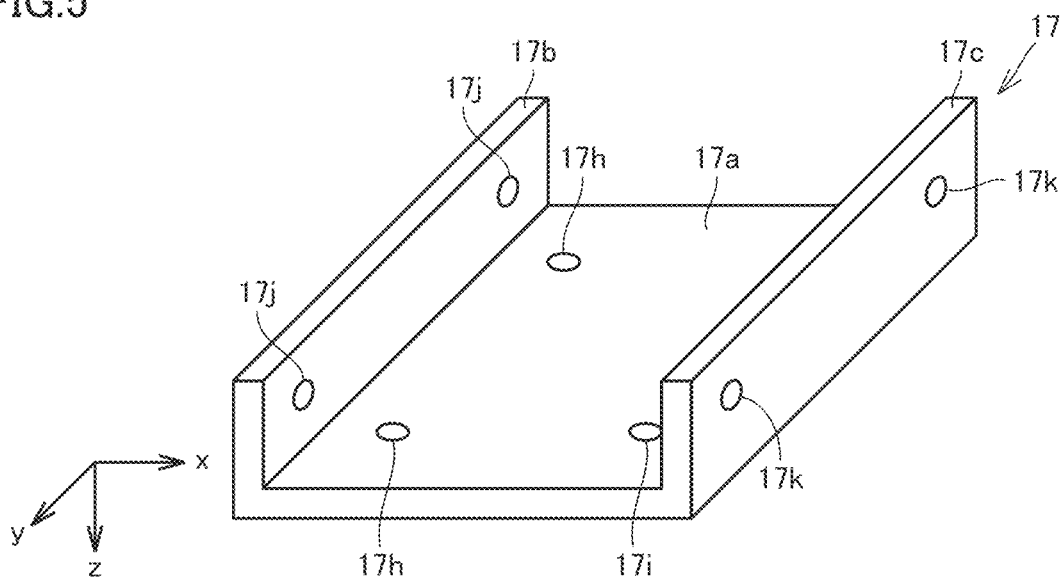
FIG. 5 is a schematic perspective view of a first heat dissipation plate included in the power converter of Embodiment 1.
Figure 6:
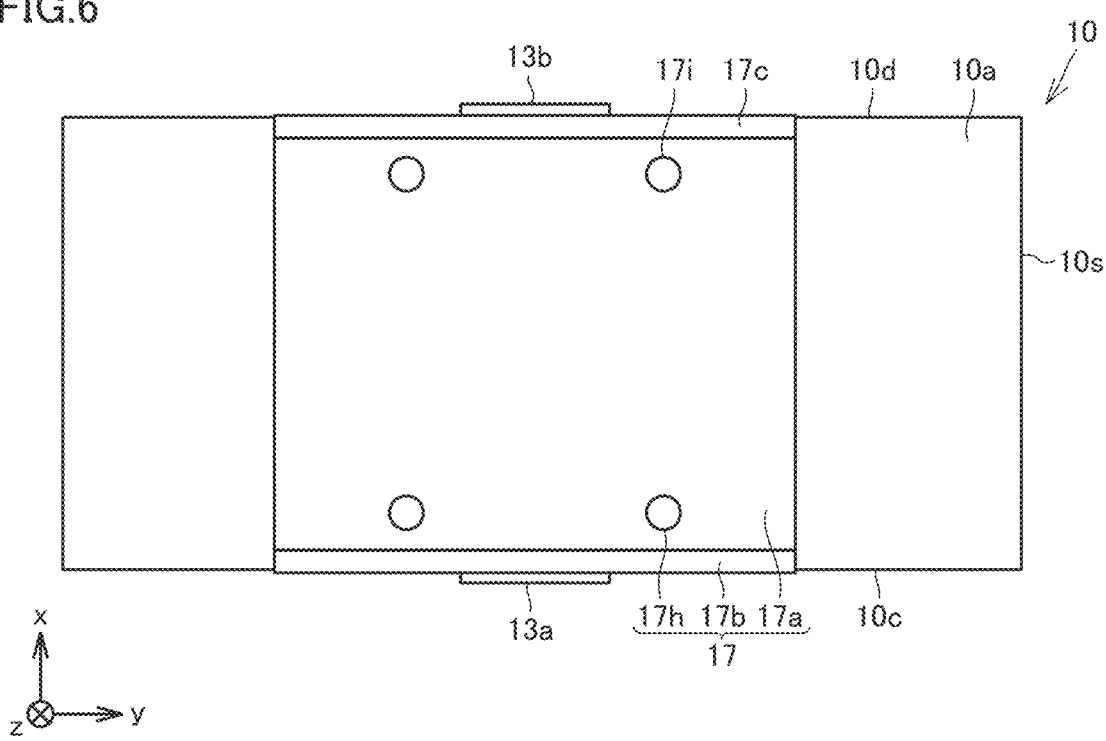
FIG. 6 is a schematic plan view of the circuit board, the first magnetic core, and the first heat dissipation plate included in the power converter according to Embodiment 1.
Figure 7:
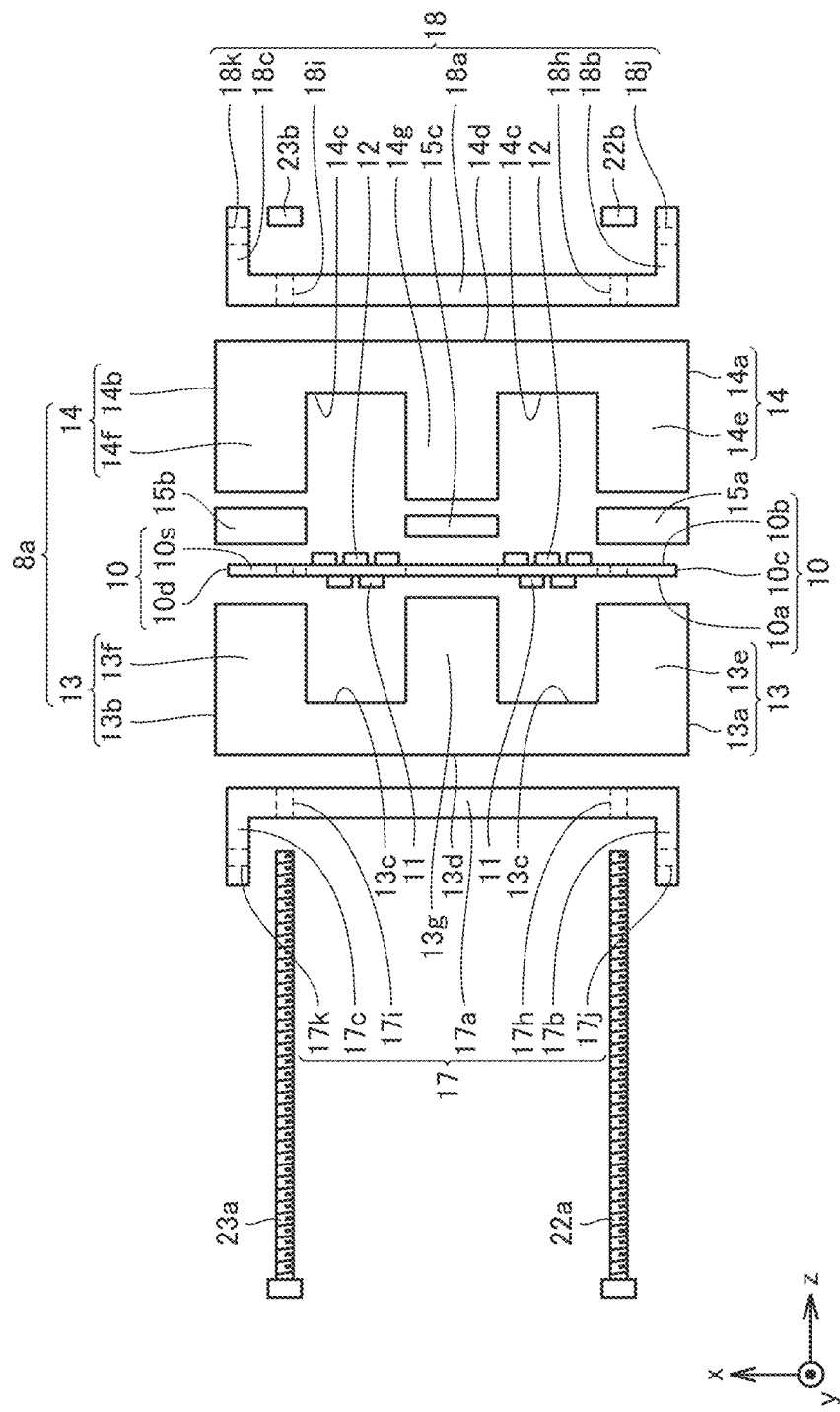
FIG. 7 is a schematic exploded side view of the power converter (excluding a first fastening member and a second fastening member) according to Embodiment 1.

As shown in FIGS. 2 and 5, first heat dissipation member 17 includes a base portion 17a and a pair of flanges 17b, 17c. Base portion 17a extends in the first direction (x direction) and the second direction (y direction). Base portion 17a is opposed to sixth surface 13d of first magnetic core member 13. Base portion 17a is thermally connected to sixth surface 13d of first magnetic core member 13.

Flange 17b is provided at one end of base portion 17a which is proximate to first portion 9a (first support surface 9d). Flange 17b faces first portion 9a (first support surface 9d) and is spaced away from first portion 9a (first support surface 9d). Flange 17b extends from base portion 17a in a direction (−z direction) away from circuit board 10. Flange 17c is provided at the other end of base portion 17a which is proximate to second portion 9b (second support surface 9e). Flange 17c faces second portion 9b (second support surface 9e) and is spaced away from second portion 9b (second support surface 9e). Flange 17c extends from base portion 17a in the direction (−z direction) away from circuit board 10. Flanges 17b, 17c can function as radiating fins in first heat dissipation member 17.

Holes 17h, 17i are provided in base portion 17a. Holes 17h are provided in a region of base portion 17a which is proximate to flange 17b. Holes 17i are provided in a region of base portion 17a which is proximate to flange 17c. Holes 17j are provided in flange 17b. Holes 17k are provided in flange 17c.

Second heat dissipation member 18 is thermally connected to second magnetic core member 14. Second heat dissipation member 18b may be in direct contact with second magnetic core member 14. An electrically insulating heat-transfer layer (not shown) may be interposed between second heat dissipation member 18 and second magnetic core member 14. Second heat dissipation member 18 is spaced away from first portion 9a. Second heat dissipation member 18 is spaced away from second portion 9b.

As shown in FIG. 2, second heat dissipation member 18 includes a base portion 18a and a pair of flanges 18b, 18c. Base portion 18a extends in the first direction (x direction) and the second direction (y direction). Base portion 18a is opposed to eighth surface 14d of second magnetic core member 14. Base portion 18a is thermally connected to eighth surface 14d of second magnetic core member 14.

Flange 18b is provided at one end of base portion 18a which is proximate to first portion 9a (first support surface 9d). Flange 18b faces first portion 9a (first support surface 9d) and is spaced away from first portion 9a (first support surface 9d). Flange 18b extends from base portion 18a in a direction (+z direction) away from circuit board 10. Flange 18c is provided at the other end of base portion 18a which is proximate to second portion 9b (second support surface 9e). Flange 18c faces second portion 9b (second support surface 9e) and is spaced away from second portion 9b (second support surface 9e). Flange 18c extends from base portion 18a in the direction (+z direction) away from circuit board 10. Flanges 18b, 18c function as radiating fins in second heat dissipation member 18.

Holes 18h, 18i are provided in base portion 18a. Holes 18h are provided in a region of base portion 18a which is proximate to flange 18b. Holes 18i are provided in a region of base portion 18a which is proximate to flange 18c. Holes 18j are provided in flange 18b. Holes 18k are provided in flange 18c.

First fastening members 19a, 19b fasten first heat dissipation member 17 and second heat dissipation member 18 to first portion 9a of housing 9. Specifically, first fastening member 19a fastens flange 17b of first heat dissipation member 17 to first portion 9a. First fastening member 19a is fixed to first portion 9a through hole 17j provided in flange 17b. First fastening member 19b fastens flange 18b of second heat dissipation member 18 to first portion 9a. First fastening member 19b is fixed to first portion 9a through hole 18j provided in flange 18b. First fastening members 19a, 19b are, for example, screws, bolts, or rivets.

Second fastening members 20a, 20b fasten first heat dissipation member 17 and second heat dissipation member 18 to second portion 9b of housing 9. Specifically, second fastening member 20a fastens flange 17c of first heat dissipation member 17 to second portion 9b. Second fastening member 20a is fixed to second portion 9b through hole 17k provided in flange 17c. Second fastening member 20b fastens flange 18c of second heat dissipation member 18 to second portion 9b. Second fastening member 20b is fixed to second portion 9b through hole 18k provided in flange 18c. Second fastening members 20a, 20b are, for example, screws, bolts, or rivets.

The first coupling member (22a, 22b, 23a, 23b) couples first magnetic core member 13, circuit board 10, and second magnetic core member 14 to each other. First magnetic core member 13, circuit board 10, and second magnetic core member 14 are integrated by the first coupling member (22a, 22b, 23a, 23b) to form an assembly unit. Particularly, the first coupling member (22a, 22b, 23a, 23b) couples first heat dissipation member 17, first magnetic core member 13, circuit board 10, second magnetic core member 14, and second heat dissipation member 18 to each other. First heat dissipation member 17, first magnetic core member 13, circuit board 10, second magnetic core member 14, and second heat dissipation member 18 are integrated by the first coupling member (22a, 22b, 23a, 23b) to form an assembly unit.

The first coupling member (22a, 22b, 23a, 23b) may include, for example, bolts 22a, 23a and nuts 22b, 23b. Bolt 22a is fastened to nut 22b through hole 10h of circuit board 10. Particularly, bolt 22a is fastened to nut 22b through hole 17h of first heat dissipation member 17, hole 10h of circuit board 10, and hole 18h of second heat dissipation member 18. Bolt 23a is fastened to nut 23b through hole 10i of circuit board 10. Particularly, bolt 23a is fastened to nut 23b through hole 17i of first heat dissipation member 17, hole 10i of circuit board 10, and hole 18i of second heat dissipation member 18.

Figure 9:
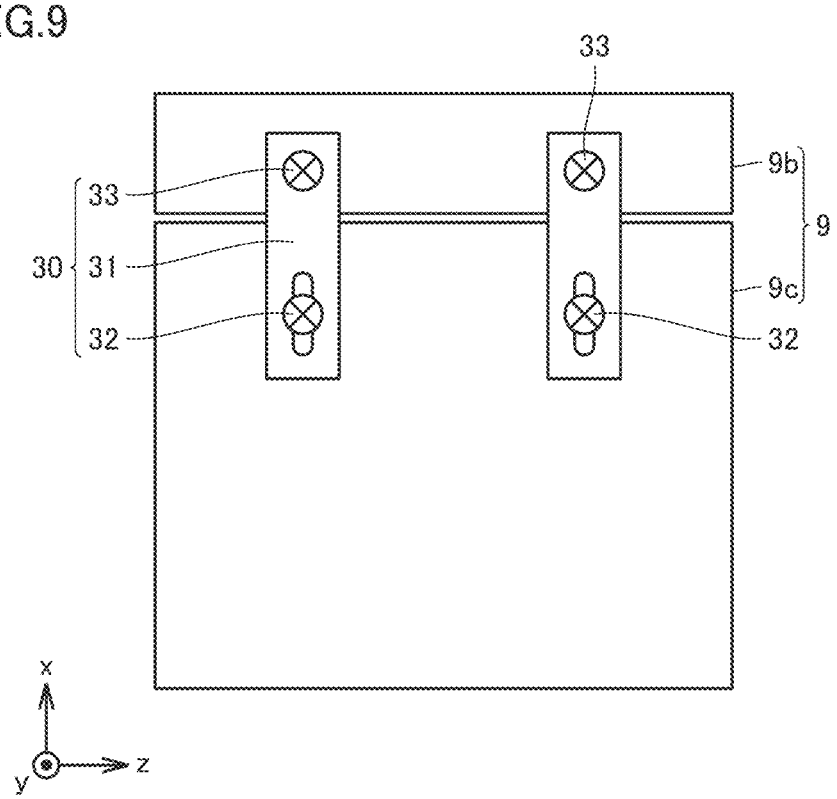
FIG. 9 is a schematic side view of a housing of each of the power converters of Embodiment 1 and Embodiment 2.

As shown in FIG. 9, second portion 9b of housing 9 is fixed to first portion 9a of housing 9, for example, with a fixing member 30. Particularly, second portion 9b is fixed to wall 9c of housing 9 which is included in first portion 9a. Fixing member 30 includes, for example, a fixing plate 31 and screws 32, 33.

Figure 10:
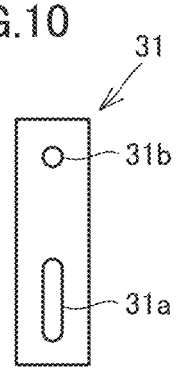
FIG. 10 is a schematic view of a fixing plate included in each of the power converters of Embodiment 1 and Embodiment 2.

As shown in FIGS. 9 and 10, an elongated hole 31a and a hole 31b are provided in fixing plate 31. Screw 32 is fastened to wall 9c through elongated hole 31a. Screw 32 fixes fixing plate 31 to wall 9c of housing 9. Screw 33 is fastened to second portion 9b of housing 9 through hole 31b. Screw 33 fixes fixing plate 31 to second portion 9b of housing 9. In pressing of second portion 9b toward first magnetic core member 13 and second magnetic core member 14 by first pressing portion 16, the length of the gap between second portion 9b and wall 9c may change to change the position of second portion 9b relative to wall 9c. Elongated hole 31a absorbs changes in the position of second portion 9b relative to wall 9c, thus allowing fixing plate 31 and screws 32, 33 to fix second portion 9b to first portion 9a (wall 9c) of housing 9.

An example method of manufacturing power converter 1 of the present embodiment will be described with reference to FIGS. 3 to 10.

As shown in FIGS. 3 and 4, the method of manufacturing power converter 1 of the present embodiment includes mounting first magnetic core 8a on circuit board 10. Specifically, first magnetic core member 13, second magnetic core member 14, and nonmagnetic spacers 15a, 15b, 15c are stacked on each other to form first magnetic core 8a. The pair of side legs and the central leg of first magnetic core 8a are fitted with recesses 10e, 10f and opening 10g of circuit board 10.

As shown in FIGS. 3 and 4, the method of manufacturing power converter 1 of the present embodiment includes forming the assembly unit including first magnetic core member 13, circuit board 10, and second magnetic core member 14 using the first coupling member (22a, 22b, 23a, 23b). Specifically, bolt 22a is passed through hole 10h of circuit board 10. Bolt 23a is passed through hole 10i of circuit board 10. Nut 22b is fastened to bolt 22a. Nut 23b is fastened to bolt 23a. Thus, first magnetic core member 13, circuit board 10, and second magnetic core member 14 are integrated by the first coupling member (22a, 22b, 23a, 23b). The assembly unit including first magnetic core member 13, circuit board 10, and second magnetic core member 14 is formed.

Particularly, the method of manufacturing power converter 1 of the present embodiment includes forming the assembly unit including first heat dissipation member 17, first magnetic core member 13, circuit board 10, second magnetic core member 14, and second heat dissipation member 18 using the first coupling member (22a, 22b, 23a, 23b). Specifically, base portion 17a of first heat dissipation member 17 is opposed to sixth surface 13d of first magnetic core member 13. Base portion 18a of second heat dissipation member 18 is opposed to eighth surface 14d of second magnetic core member 14. Bolt 22a is passed through hole 17h of first heat dissipation member 17, hole 10h of circuit board 10, and hole 18h of second heat dissipation member 18. Bolt 23a is passed through hole 17i of first heat dissipation member 17, hole 10i of circuit board 10, and hole 18i of second heat dissipation member 18. Nut 22b is fastened to bolt 22a. Nut 23b is fastened to bolt 23a. Thus, first heat dissipation member 17, first magnetic core member 13, circuit board 10, second magnetic core member 14, and second heat dissipation member 18 are integrated by the first coupling member (22a, 22b, 23a, 23b). The assembly unit including first heat dissipation member 17, first magnetic core member 13, circuit board 10, second magnetic core member 14, and second heat dissipation member 18 is formed.

Figure 8:
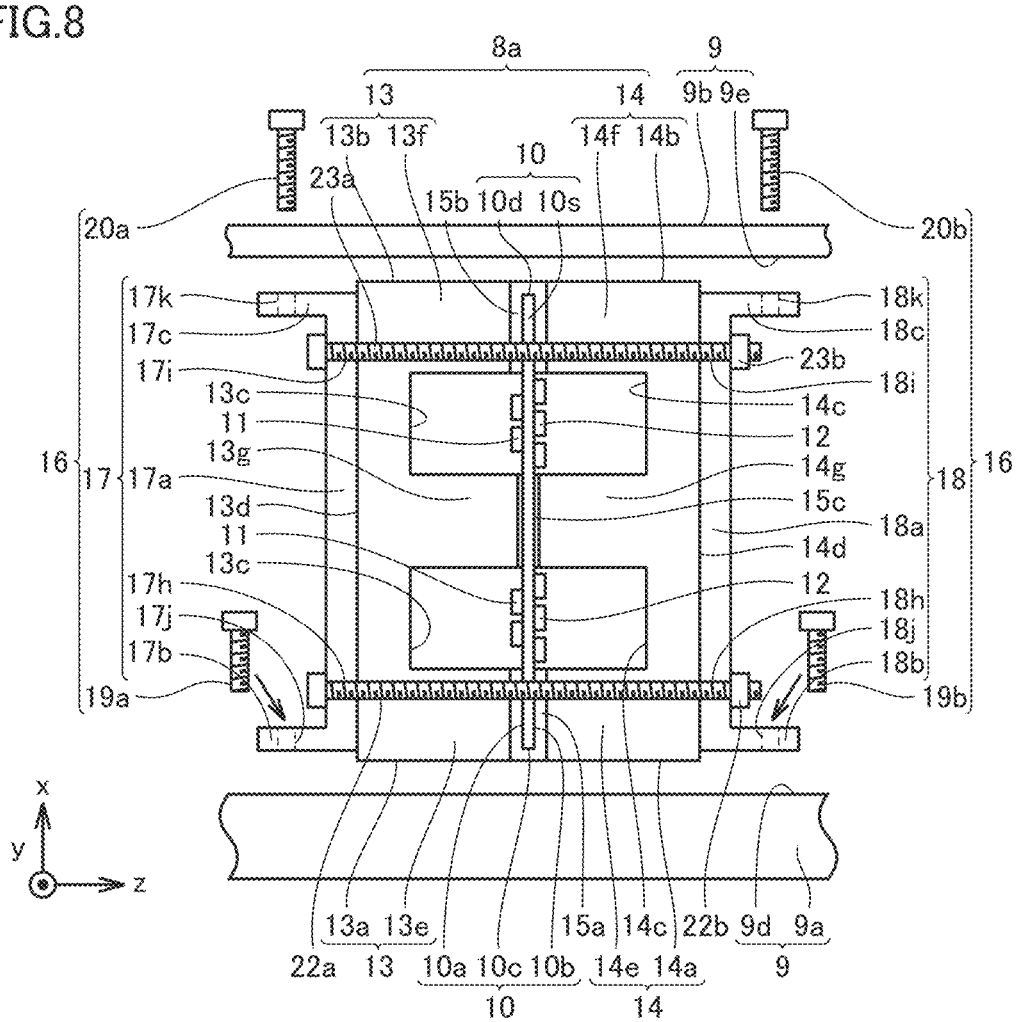
FIG. 8 is a schematic exploded side view of the power converter according to Embodiment 1.

As shown in FIG. 8, the method of manufacturing power converter 1 of the present embodiment includes fixing the assembly unit to housing 9. Specifically, the assembly unit is fixed to first portion 9a of housing 9 using first fastening members 19a, 19b. Flange 17b of first heat dissipation member 17 is fixed to first portion 9a using first fastening member 19a. Flange 18b of second heat dissipation member 18 is fixed to first portion 9a using first fastening member 19b. The assembly unit is fixed to second portion 9b of housing 9 using second fastening members 20a, 20b. Flange 17c of first heat dissipation member 17 is fixed to second portion 9b using second fastening member 20a. Flange 18c of second heat dissipation member 18 is fixed to second portion 9b using second fastening member 20b.

In the first direction (x direction), first surface 13a of first magnetic core member 13 and second surface 14a of second magnetic core member 14 are closer to first portion 9a of housing 9 than first heat dissipation member 17, second heat dissipation member 18, and first side surface 10c of circuit board 10 are to first portion 9a. First heat dissipation member 17 (flange 17b), first side surface 10c of circuit board 10, and second heat dissipation member 18 (flange 18b) are spaced away from first portion 9a (first support surface 9d) of housing 9. This allows first magnetic core member 13 and second magnetic core member 14 to be pressed toward first portion 9a using first fastening member 19a with no mechanical interference between first heat dissipation member 17 (flange 17b) and first portion 9a, between circuit board 10 and first portion 9a, and between second heat dissipation member 18 (flange 18b) and first portion 9a.

First heat dissipation member 17, first magnetic core member 13, circuit board 10, second magnetic core member 14, and second heat dissipation member 18 form the assembly unit using the first coupling member (22a, 22b, 23a, 23b). This facilitates the operation of fixing first heat dissipation member 17, first magnetic core member 13, circuit board 10, second magnetic core member 14, and second heat dissipation member 18 to first portion 9a of housing 9. The operation of pressing first magnetic core member 13 and second magnetic core member 14 toward first portion 9a is facilitated.

In the first direction (x direction), third surface 13b of first magnetic core member 13 and fourth surface 14b of second magnetic core member 14 are closer to second portion 9b of housing 9 than first heat dissipation member 17, second heat dissipation member 18, and second side surface 10d of circuit board 10 are to second portion 9b. First heat dissipation member 17 (flange 17c), second side surface 10d of circuit board 10, and second heat dissipation member 18 (flange 18c) are spaced away from second portion 9b (second support surface 9e) of housing 9. This allows second portion 9b to be pressed toward first magnetic core member 13 and second magnetic core member 14 using second fastening member 20a with no mechanical interference between first heat dissipation member 17 (flange 17c) and second portion 9b, between circuit board 10 and second portion 9b, and between second heat dissipation member 18 (flange 18c) and second portion 9b.

First heat dissipation member 17, first magnetic core member 13, circuit board 10, second magnetic core member 14, and second heat dissipation member 18 form the assembly unit using the first coupling member (22a, 22b, 23a, 23b). This facilitates the operation of fixing first heat dissipation member 17, first magnetic core member 13, circuit board 10, second magnetic core member 14, and second heat dissipation member 18 to second portion 9b of housing 9. The operation of pressing second portion 9b toward first magnetic core member 13 and second magnetic core member 14 is facilitated.

As shown in FIG. 9, the method of manufacturing power converter 1 of the present embodiment includes fixing second portion 9b of housing 9 to first portion 9a of housing 9 using fixing member 30. Particularly, second portion 9b is fixed to wall 9c of housing 9 which is included in first portion 9a of housing 9. Fixing member 30 includes, for example, fixing plate 31 and screws 32, 33. As shown in FIGS. 9 and 10, elongated hole 31a and hole 31b are provided in fixing plate 31. Screw 32 is fastened to wall 9c through elongated hole 31a. Screw 32 fixes fixing plate 31 to wall 9c of housing 9. Screw 33 is fastened to second portion 9b of housing 9 through hole 31b. Screw 33 fixes fixing plate 31 to second portion 9b of housing 9.

Figure 11:
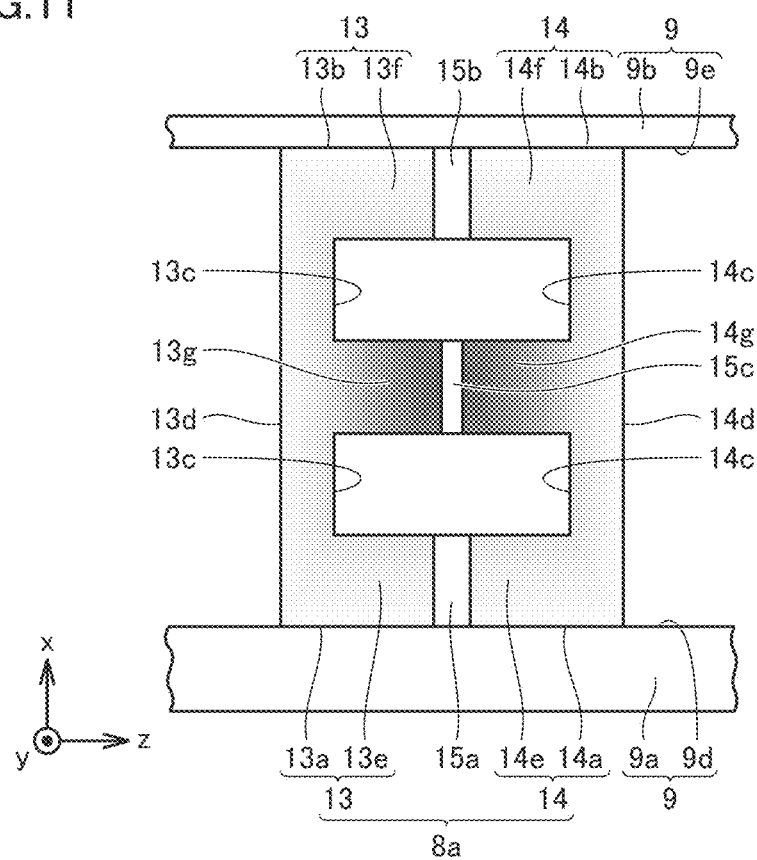
FIG. 11 shows a temperature distribution of the first magnetic core during operation of the power converter of Embodiment 1.
Figure 12:
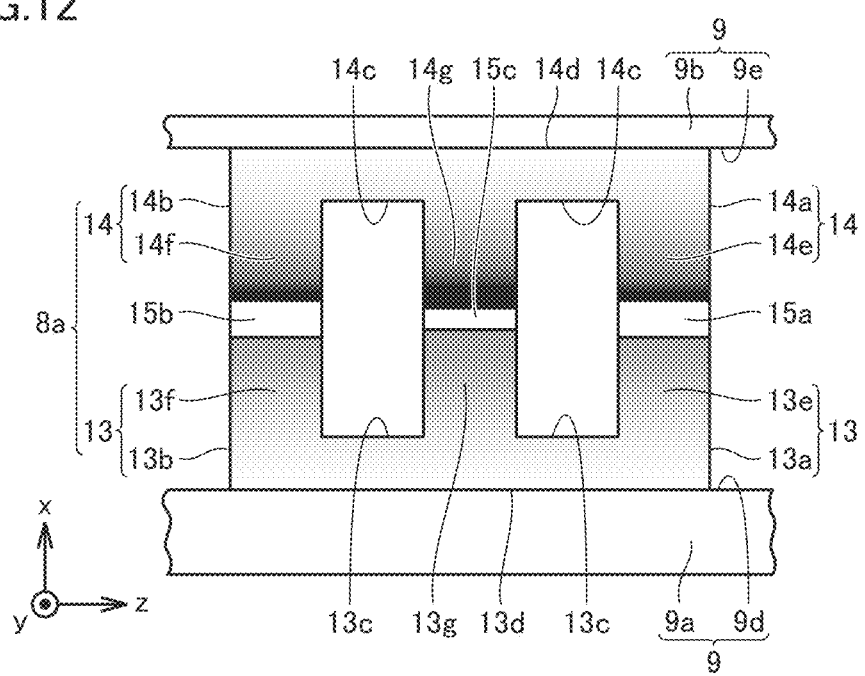
FIG. 12 shows a temperature distribution of a first magnetic core during operation of a power converter of a comparative example.

Example functions of power converter 1 of the present embodiment will be described with reference to FIG. 11 while comparing with a power converter of a comparative example shown in FIG. 12. In FIGS. 11 and 12, shading in first magnetic core member 13 and second magnetic core member 14 shows a temperature distribution in first magnetic core member 13 and second magnetic core member 14 during operation of the power converter. A darker shaded portion in each of first magnetic core member 13 and second magnetic core member 14 indicates that temperature is higher in the portion.

As shown in FIG. 11, in power converter 1 of the present embodiment, first magnetic core member 13 and second magnetic core member 14 are both in contact with first portion 9a of housing 9 to be thermally connected to first portion 9a of housing 9. First magnetic core member 13 and second magnetic core member 14 are both in contact with second portion 9b of housing 9 to be thermally connected to second portion 9b of housing 9. Even when second portion 9b of housing 9 has lower heat dissipation performance than first portion 9a of housing 9, thus, first magnetic core member 13 and second magnetic core member 14 are both cooled in a similar manner. Even when first magnetic core 8a includes a nonmagnetic spacer having a lower thermal conductivity than first magnetic core member 13 and second magnetic core member 14, first magnetic core member 13 and second magnetic core member 14 are both cooled in a similar manner. Power converter 1 of the present embodiment has a relatively low maximum temperature of first magnetic core 8a during operation of power converter 1, and can reduce a loss in first magnetic core 8a.

Contrastingly, in the power converter of the comparative example, only first magnetic core member 13 is in contact with first portion 9a of housing 9 to be thermally connected to first portion 9a of housing 9, as shown in FIG. 12. Second magnetic core member 14 is distant from first portion 9a of housing 9. Only second magnetic core member 14 is in contact with second portion 9b of housing 9 to be thermally connected to second portion 9b of housing 9. First magnetic core member 13 is distant from second portion 9b of housing 9. When second portion 9b of housing 9 has lower heat dissipation performance than first portion 9a of housing 9, thus, second magnetic core member 14 is cooled insufficiently. When first magnetic core 8a includes a nonmagnetic spacer having a lower thermal conductivity than first magnetic core member 13 and second magnetic core member 14, second magnetic core member 14 is cooled insufficiently. The power converter of the comparative example has a relatively high maximum temperature of first magnetic core 8a during operation of the power converter, and a loss in first magnetic core 8a increases.

Figure 13:
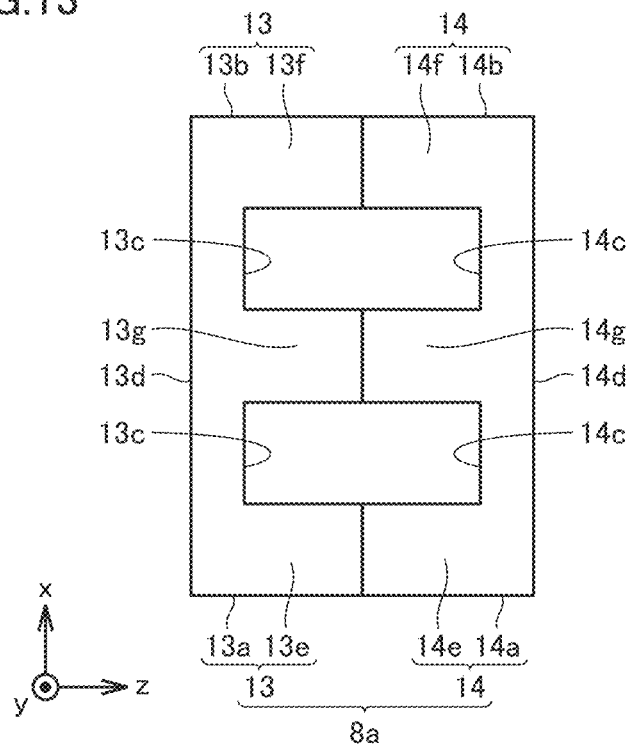
FIG. 13 shows a first magnetic core of a variation of Embodiment 1.
Figure 14:
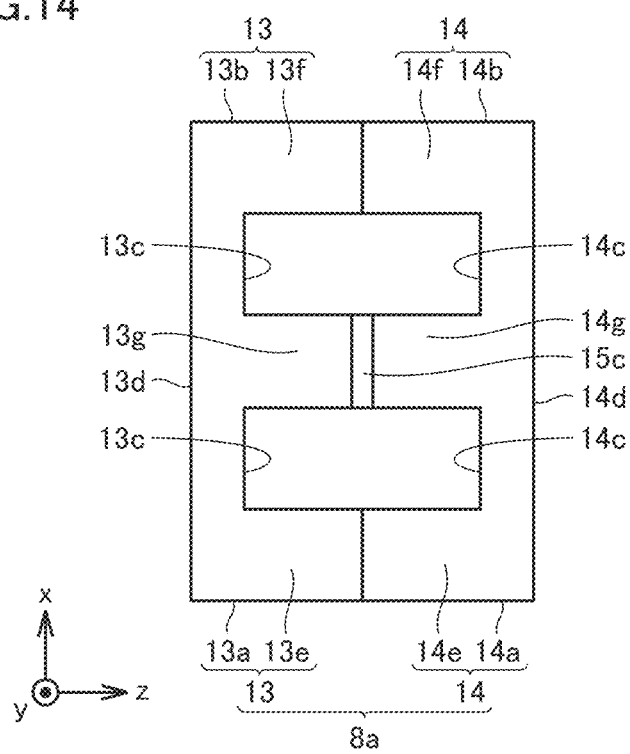
FIG. 14 shows a first magnetic core of a variation of Embodiment 1.
Figure 15:
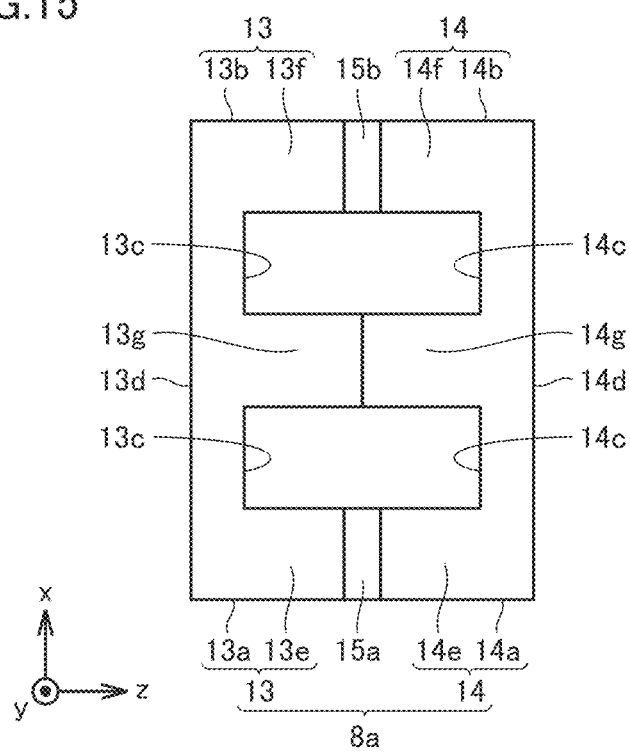
FIG. 15 shows a first magnetic core of a variation of Embodiment 1.

As shown in FIG. 13, in one variation of the present embodiment, first magnetic core 8a does not include nonmagnetic spacers 15a, 15b, 15c, and first magnetic core member 13 may be in direct contact with second magnetic core member 14. As shown in FIG. 14, in another variation of the present embodiment, first magnetic core 8a does not include nonmagnetic spacers 15a, 15b, and the pair of side legs 13e, 13f of first magnetic core member 13 may be in direct contact with the pair of side legs 14e, 14f of second magnetic core member 14. As shown in FIG. 15, in still another variation of the present embodiment, first magnetic core 8a does not include nonmagnetic spacer 15c, and central leg 13g of first magnetic core member 13 may be in direct contact with central leg 14g of second magnetic core member 14. First magnetic core 8a is not limited to an EE magnetic core and may be, for example, an EI core.

The effects of power converter 1 of the present embodiment will be described.

Power converter 1 of the present embodiment includes circuit board 10, first magnetic core 8a, and housing 9. Circuit board 10 includes insulating substrate 10s and the first coil conductor (coil conductor 11, coil conductor 12). Insulating base material 10s includes first main surface 10a, second main surface 10b opposite to first main surface 10a, first side surface 10c, and second side surface 10d opposite to first side surface 10c. First side surface 10c and second side surface 10d each connect first main surface 10a to second main surface 10b. The first coil conductor (coil conductor 11, coil conductor 12) is provided on at least one of first main surface 10a or second main surface 10b. First magnetic core 8a includes first magnetic core member 13 and second magnetic core member 14. Housing 9 accommodates circuit board 10 and first magnetic core 8a. The first coil conductor (coil conductor 11, coil conductor 12) extends to surround a part of first magnetic core 8a. Housing 9 includes first portion 9a. First side surface 10c of insulating substrate 10s is opposed to first portion 9a of housing 9 and is spaced away from first portion 9a of housing 9. First magnetic core member 13 and second magnetic core member 14 are both thermally connected to first portion 9a.

Thus, first magnetic core member 13 and second magnetic core member 14 are cooled by first portion 9a of housing 9. The maximum temperature of first magnetic core 8a during operation of power converter 1 can be lowered. A loss in first magnetic core 8a is reduced. The power conversion efficiency of power converter 1 can be improved. An output of power converter 1 can be increased. Power converter 1 can be miniaturized. Decreases in the saturation flux density and permeability of first magnetic core 8a can be reduced to prevent superposition of spike noise on a voltage output from power converter 1.

In power converter 1 of the present embodiment, first magnetic core member 13 includes first surface 13a opposed to first portion 9a. Second magnetic core member 14 includes second surface 14a opposed to first portion 9a. First surface 13a and second surface 14a are closer to first portion 9a than first side surface 10c of circuit board 10 is to first portion 9a. This allows first magnetic core member 13 and second magnetic core member 14 to be cooled by first portion 9a of housing 9 with no mechanical interference between circuit board 10 and first portion 9a. The maximum temperature of first magnetic core 8a during operation of power converter 1 can be lowered. A loss in first magnetic core 8a can be reduced. The power conversion efficiency of power converter 1 can be improved.

Power converter 1 of the present embodiment further includes first pressing portion 16. First portion 9a is pressed by first pressing portion 16 toward first magnetic core member 13 and second magnetic core member 14 to be thermally connected to first magnetic core member 13 and second magnetic core member 14. Thus, first magnetic core member 13 and second magnetic core member 14 are thermally connected to first portion 9a of housing 9 more reliably. This facilitates heat dissipation from first magnetic core member 13 to first portion 9a of housing 9 and heat dissipation from second magnetic core member 14 to first portion 9a of housing 9. The maximum temperature of first magnetic core 8a during operation of power converter 1 can be lowered. A loss in first magnetic core 8a is reduced. The power conversion efficiency of power converter 1 can be improved.

In power converter 1 of the present embodiment, first pressing portion 16 includes first heat dissipation member 17, second heat dissipation member 18, and first fastening members 19a, 19b. First heat dissipation member 17 is thermally connected to first magnetic core member 13 and is spaced away from first portion 9a. Second heat dissipation member 18 is thermally connected to second magnetic core member 14 and is spaced away from first portion 9a. First fastening members 19a, 19b fasten first heat dissipation member 17 and second heat dissipation member 18 to first portion 9a.

First heat dissipation member 17 is thermally connected to first magnetic core member 13, and second heat dissipation member 18 is thermally connected to second magnetic core member 14. Thus, the heat generated in first magnetic core member 13 is dissipated from first portion 9a, as well as from first heat dissipation member 17. The heat generated in second magnetic core member 14 is dissipated from first portion 9a, as well as from second heat dissipation member 18. The maximum temperature of first magnetic core 8a during operation of power converter 1 can be lowered. A loss in first magnetic core 8a can be reduced. The power conversion efficiency of power converter 1 can be improved.

Further, first heat dissipation member 17 and second heat dissipation member 18 are spaced away from first portion 9a. This can allow first magnetic core member 13 and second magnetic core member 14 to be pressed toward first portion 9a with no mechanical interference between first heat dissipation member 17 (flange 17b) and first portion 9a, between circuit board 10 and first portion 9a, and between second heat dissipation member 18 (flange 18b) and first portion 9a. This facilitates heat dissipation from first magnetic core member 13 to first portion 9a of housing 9 and heat dissipation from second magnetic core member 14 to first portion 9a of housing 9. The maximum temperature of first magnetic core 8a during operation of power converter 1 can be lowered. A loss in first magnetic core 8a can be reduced. The power conversion efficiency of power converter 1 can be improved.

In power converter 1 of the present embodiment, housing 9 further includes second portion 9b opposed to first portion 9a. Second side surface 10d is opposed to second portion 9b and is spaced away from second portion 9b. First magnetic core member 13 and second magnetic core member 14 are both further thermally connected to second portion 9b.

Thus, the heat generated in first magnetic core member 13 is dissipated from first portion 9a, as well as from second portion 9b. The heat generated in second magnetic core member 14 is dissipated from first portion 9a, as well as from second portion 9b. The maximum temperature of first magnetic core 8a during operation of power converter 1 can be lowered. A loss in first magnetic core 8a can be reduced. The power conversion efficiency of power converter 1 can be improved.

In power converter 1 of the present embodiment, first magnetic core member 13 includes third surface 13b opposed to second portion 9b. Second magnetic core member 14 includes fourth surface 14b opposed to second portion 9b. Third surface 13b and fourth surface 14b are closer to second portion 9b than second side surface 10d of circuit board 10 is to second portion 9b. This allows first magnetic core member 13 and second magnetic core member 14 to be cooled by first portion 9a and second portion 9b of housing 9 with no mechanical interference between circuit board 10 and second portion 9b. The maximum temperature of first magnetic core 8a during operation of power converter 1 can be lowered. A loss in first magnetic core 8a can be reduced. The power conversion efficiency of power converter 1 can be improved.

In power converter 1 of the present embodiment, first portion 9a has a higher thermal conductance than second portion 9b. First magnetic core member 13 and second magnetic core member 14 are both thermally connected to first portion 9a and second portion 9b of housing 9, and accordingly, first magnetic core member 13 and second magnetic core member 14 are cooled by first portion 9a and second portion 9b of housing 9. The maximum temperature of first magnetic core 8a during operation of power converter 1 can be lowered. A loss in first magnetic core 8a can be reduced. The power conversion efficiency of power converter 1 can be improved.

Power converter 1 of the present embodiment further includes first pressing portion 16. First portion 9a is pressed by first pressing portion 16 toward first magnetic core member 13 and second magnetic core member 14 to be thermally connected to first magnetic core member 13 and second magnetic core member 14. Second portion 9b is pressed by first pressing portion 16 toward first magnetic core member 13 and second magnetic core member 14 to be thermally connected to first magnetic core member 13 and second magnetic core member 14.

Thus, first magnetic core member 13 and second magnetic core member 14 are thermally connected to first portion 9a and second portion 9b of housing 9 more reliably. This facilitates heat dissipation from first magnetic core member 13 to first portion 9a and second portion 9b of housing 9 and heat dissipation from second magnetic core member 14 to first portion 9a and second portion 9b of housing 9. The maximum temperature of first magnetic core 8a during operation of power converter 1 can be lowered. A loss in first magnetic core 8a can be reduced. The power conversion efficiency of power converter 1 can be improved.

In power converter 1 of the present embodiment, first pressing portion 16 includes first heat dissipation member 17, second heat dissipation member 18, first fastening members 19a, 19b, and second fastening members 20a, 20b. First heat dissipation member 17 is thermally connected to first magnetic core member 13 and is spaced away from first portion 9a and second portion 9b. Second heat dissipation member 18 is thermally connected to second magnetic core member 14 and is spaced away from first portion 9a and second portion 9b. First fastening members 19a, 19b fasten first heat dissipation member 17 and second heat dissipation member 18 to first portion 9a. Second fastening members 20a, 20b fasten first heat dissipation member 17 and second heat dissipation member 18 to second portion 9b.

First heat dissipation member 17 is thermally connected to first magnetic core member 13, and second heat dissipation member 18 is thermally connected to second magnetic core member 14. Thus, the heat generated in first magnetic core member 13 is dissipated from first portion 9a and second portion 9b, as well as from first heat dissipation member 17. The heat generated in second magnetic core member 14 is dissipated from first portion 9a and second portion 9b, as well as from second heat dissipation member 18. The maximum temperature of first magnetic core 8a during operation of power converter 1 can be lowered. A loss in first magnetic core 8a can be reduced. The power conversion efficiency of power converter 1 can be improved.

Further, first heat dissipation member 17 and second heat dissipation member 18 are spaced away from first portion 9a and second portion 9b. This can allow first magnetic core member 13 and second magnetic core member 14 to be pressed toward first portion 9a and second portion 9b with no mechanical interference between first heat dissipation member 17 (flange 17b) and first portion 9a, between first heat dissipation member 17 (flange 17b) and second portion 9b, between circuit board 10 and first portion 9a, between circuit board 10 and second portion 9b, between second heat dissipation member 18 (flange 18b) and first portion 9a, and between second heat dissipation member 18 (flange 18b) and second portion 9b. This facilitates heat dissipation from first magnetic core member 13 to first portion 9a and second portion 9b of housing 9 and heat dissipation from second magnetic core member 14 to first portion 9a and second portion 9b of housing 9. The maximum temperature of first magnetic core 8a during operation of power converter 1 can be lowered. A loss in first magnetic core 8a can be reduced. The power conversion efficiency of power converter 1 can be improved.

Power converter 1 of the present embodiment further includes the first coupling member (22a, 22b, 23a, 23b) coupling first magnetic core member 13, circuit board 10, and second magnetic core member 14 to each other. In the present embodiment, first magnetic core member 13, circuit board 10, and second magnetic core member 14 are integrated using the first coupling member (22a, 22b, 23a, 23b) to form the assembly unit. This facilitates the operation of fixing first magnetic core member 13, circuit board 10, and second magnetic core member 14 to housing 9. The operation of pressing first portion 9a of housing 9 toward first magnetic core member 13 and second magnetic core member 14 is facilitated. The operation of pressing second portion 9b of housing 9 toward first magnetic core member 13 and second magnetic core member 14 is facilitated.

Power converter 1 of the present embodiment further includes the first coupling member (22a, 22b, 23a, 23b) coupling first heat dissipation member 17, first magnetic core member 13, circuit board 10, second magnetic core member 14, and second heat dissipation member 18 to each other. In the present embodiment, first heat dissipation member 17, first magnetic core member 13, circuit board 10, second magnetic core member 14, and second heat dissipation member 18 are integrated using the first coupling member (22a, 22b, 23a, 23b) to form the assembly unit. This facilitates the operation of fixing first heat dissipation member 17, first magnetic core member 13, circuit board 10, second magnetic core member 14, and second heat dissipation member 18 to housing 9. The operation of pressing first portion 9a of housing 9 toward first magnetic core member 13 and second magnetic core member 14 is facilitated. The operation of pressing second portion 9b of housing 9 toward first magnetic core member 13 and second magnetic core member 14 is facilitated.

Embodiment 2

A power converter 1b according to Embodiment 2 will be described with reference to FIGS. 1 and 16 to 21. As shown in FIG. 1, the circuitry of power converter 1b of the present embodiment is similar to the circuitry of power converter 1 of Embodiment 1. In the present embodiment, a larger current flows through smoothing reactor 6 than in Embodiment 1.

Power converter 1b of the present embodiment is similar in configuration to power converter 1 of Embodiment 1 and is different mainly in the following respects.

In the present embodiment, a larger current flows through smoothing reactor 6 than in Embodiment 1. In order to improve the power conversion efficiency of power converter 1b, thus, the magnetic core included in smoothing reactor 6 needs to be cooled, in addition to the magnetic core included in transformer 4. In the present embodiment, the heat generated in the magnetic core included in smoothing reactor 6 is dissipated to first portion 9a of housing 9 or the like to cool the magnetic core included in smoothing reactor 6.

Figure 16:
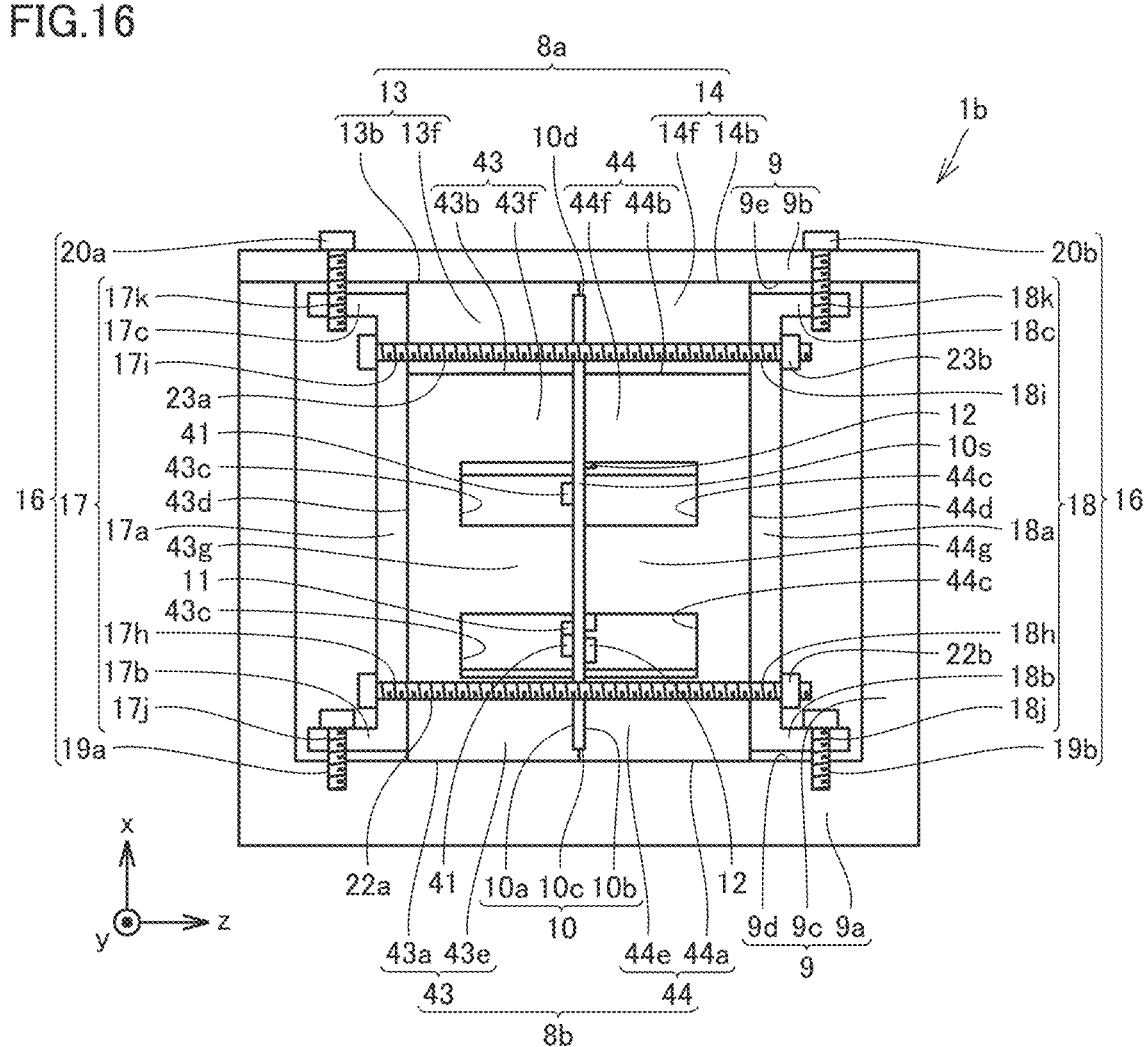
FIG. 16 is a schematic side view of an interior of the housing of the power converter of Embodiment 2.

As shown in FIG. 16, power converter 1b further includes second magnetic core 8b. Housing 9 further accommodates second magnetic core 8b. Circuit board 10 further includes second coil conductor 41. Second magnetic core 8b and second coil conductor 41 constitute, for example, smoothing reactor 6. Smoothing reactor 6 shown in FIG. 1 is further mounted on circuit board 10.

Figure 17:
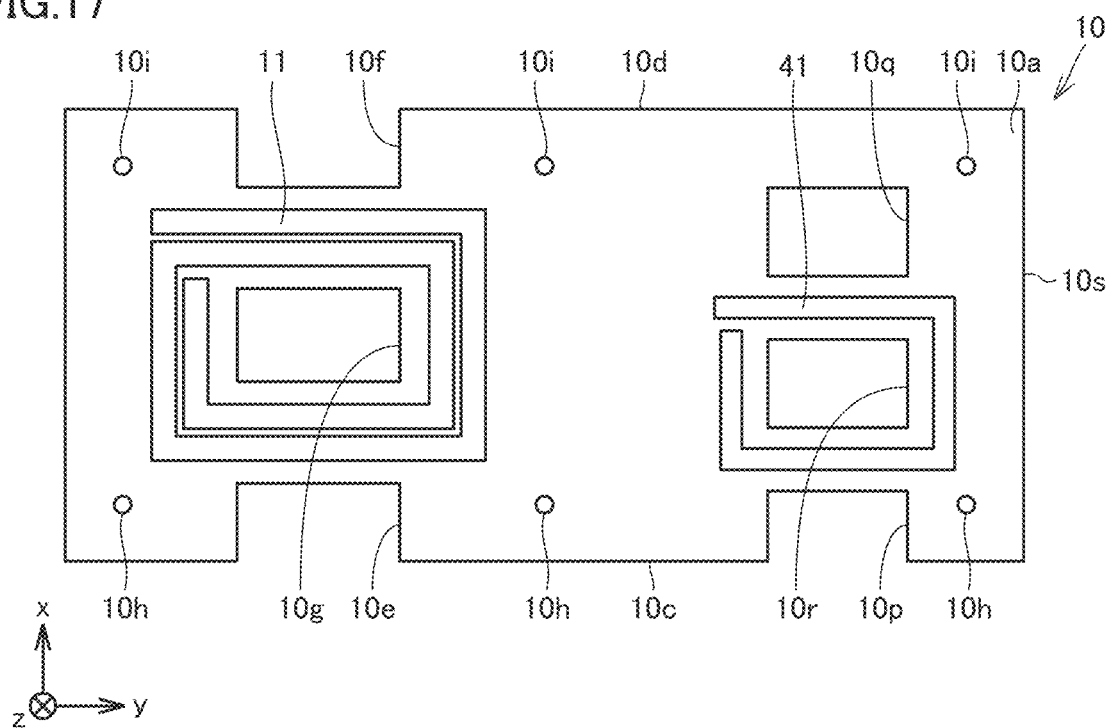
FIG. 17 is a schematic front view of a circuit board included in the power converter of Embodiment 2.
Figure 18:
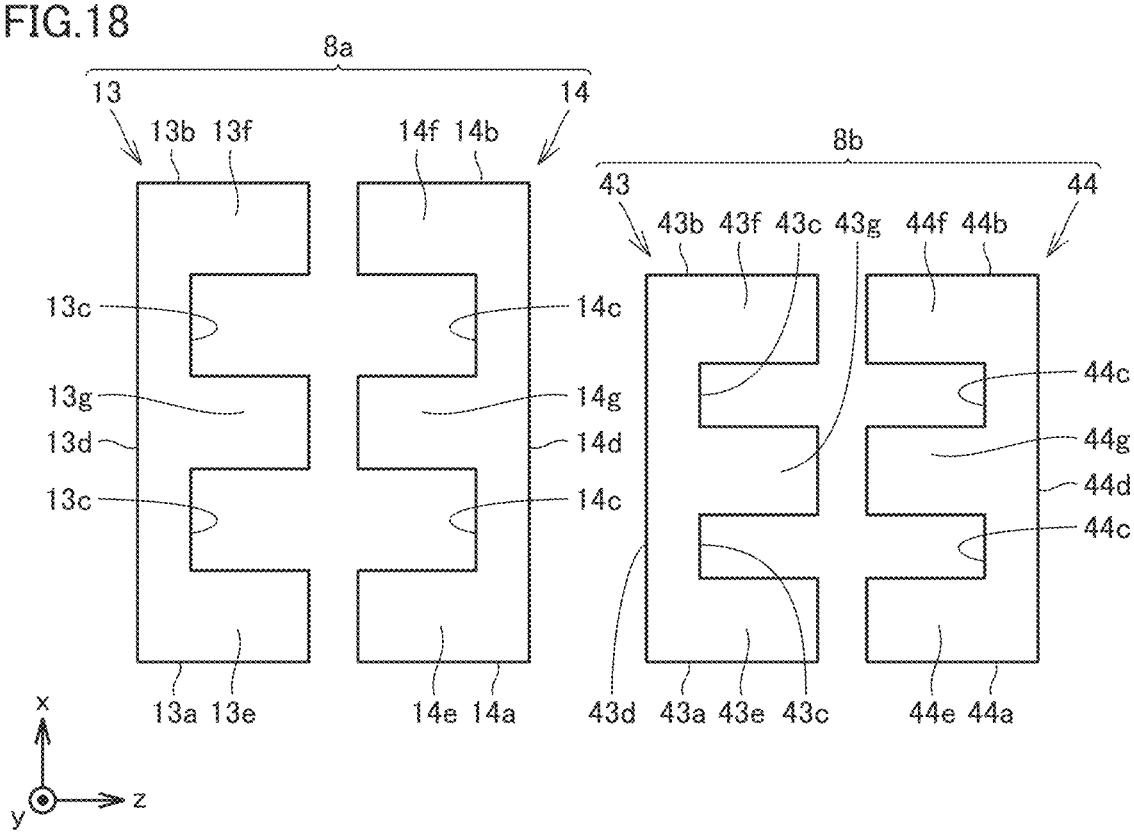
FIG. 18 is a schematic side view of a first magnetic core and a second magnetic core included in the power converter of Embodiment 2.

As shown in FIGS. 16 and 17, a recess 10p is provided in first side surface 10c of insulating substrate 10s. An opening 10q is provided in insulating substrate 10s. An opening 10r is provided in insulating substrate 10s. Recess 10p and openings 10q, 10r extend from first main surface 10a to second main surface 10b through insulating substrate 10s. Opening 10r is provided between recess 10p and opening 10q. Recess 10p and openings 10q, 10r are arranged in the first direction (x direction). Hole 10h is also provided on the side distant from recess 10e with respect to recess 10p. Hole 10i is also provided on the side distant from recess 10f with respect to opening 10q.

Second coil conductor 41 is provided on at least one of first main surface 10a or second main surface 10b. Particularly, second coil conductor 41 is provided on first main surface 10a of circuit board 10. Second coil conductor 41 extends to surround a part of second magnetic core 8b (e.g., a central leg of second magnetic core 8b). Specifically, second coil conductor 41 extends spirally around opening 10r. Second coil conductor 41 is made of a conducting material, such as copper (Cu), silver (Ag), gold (Au), tin (Sn), copper (Cu) alloy, nickel (Ni) alloy, gold (Au) alloy, silver (Ag) alloy, or tin (Sn) alloy. For example, second coil conductor 41 is a thin conductor layer having a thickness of not less than 1 μm and not greater than 5000 μm. A part of second coil conductor 41 may be covered with an insulating film (not shown) such as a solder resist.

Second magnetic core 8b includes a third magnetic core member 43 and a fourth magnetic core member 44. Third magnetic core member 43 and fourth magnetic core member 44 are separate from each other. For example, third magnetic core member 43 and fourth magnetic core member 44 are each made of a silicon steel plate, or a magnetic material such as permalloy or ferrite.

Third magnetic core member 43 includes an eleventh surface 43a, a thirteenth surface 43b opposite to eleventh surface 43a, a fifteenth surface 43c facing first main surface 10a of circuit board 10, and a sixteenth surface 43d opposite to fifteenth surface 43c. Eleventh surface 43a and thirteenth surface 43b extend in the second direction (y direction) and the third direction (z direction) perpendicular to the first direction (x direction) and the second direction (y direction). Eleventh surface 43a is opposed to first portion 9a (first support surface 9d) of housing 9. Thirteenth surface 43b is opposed to second portion 9b (second support surface 9e) of housing 9. Fifteenth surface 43c and sixteenth surface 43d extend in the first direction (x direction) and the second direction (y direction). Sixteenth surface 43d may connect eleventh surface 43a to thirteenth surface 43b.

Fourth magnetic core member 44 includes a twelfth surface 44a, a fourteenth surface 44b opposite to twelfth surface 44a, a seventeenth surface 44c facing second main surface 10b of circuit board 10, and an eighteenth surface 44d opposite to seventeenth surface 44c. Twelfth surface 44a and fourteenth surface 44b extend in the second direction (y direction) and the third direction (z direction) perpendicular to the first direction (x direction) and the second direction (y direction). Twelfth surface 44a is opposed to first portion 9a (first support surface 9d) of housing 9. Fourteenth surface 44b is opposed to second portion 9b (second support surface 9e) of housing 9. Seventeenth surface 44c and eighteenth surface 44d extend in the first direction (x direction) and the second direction (y direction). Eighteenth surface 44d may connect twelfth surface 44a to fourteenth surface 44b.

In the first direction (x direction), eleventh surface 43a of third magnetic core member 43 and twelfth surface 44a of fourth magnetic core member 44 are closer to first portion 9a of housing 9 than third heat dissipation member 47, fourth heat dissipation member 48, and first side surface 10c of circuit board 10 are to first portion 9a. In the first direction (x direction), thirteenth surface 43b of third magnetic core member 43 and fourteenth surface 44b of fourth magnetic core member 44 are closer to second portion 9b of housing 9 than third heat dissipation member 47 and fourth heat dissipation member 48 are to second portion 9b. In the first direction (x direction), thirteenth surface 43b of third magnetic core member 43 and fourteenth surface 44b of fourth magnetic core member 44 are farther from second portion 9b of housing 9 than first heat dissipation member 17, second heat dissipation member 18, and second side surface 10d of circuit board 10 are from second portion 9b. Twelfth surface 44a of fourth magnetic core member 44 may be flush with eleventh surface 43a of third magnetic core member 43. Fourteenth surface 44b of fourth magnetic core member 44 may be flush with thirteenth surface 43b of third magnetic core member 43.

Second magnetic core 8b is, for example, an EE magnetic core, and third magnetic core member 43 and fourth magnetic core member 44 each have an E-shape. Specifically, third magnetic core member 43 includes a pair of side legs 43e, 43f and a central leg 43g. Central leg 43g is provided between the pair of side legs 43e, 43f. The pair of side legs 43e, 43f and central leg 43g are arranged in the first direction (x direction). The pair of side legs 43e, 43f and central leg 43g project from fifteenth surface 43c toward circuit board 10. Fourth magnetic core member 44 includes a pair of side legs 44e, 44f and a central leg 44g. Central leg 44g is provided between the pair of side legs 44e, 44f. The pair of side legs 44e, 44f and central leg 44g are arranged in the first direction (x direction). The pair of side legs 44e, 44f and central leg 44g project from seventeenth surface 44c toward circuit board 10.

Second magnetic core 8b does not include nonmagnetic spacers 15a, 15b, 15c (see FIG. 2). Second magnetic core 8b is positioned by circuit board 10. A pair of side legs and the central leg of second magnetic core 8b are fitted with recess 10p and openings 10q, 10r of circuit board 10. Specifically, side leg 43e of third magnetic core member 43 and side leg 44e of fourth magnetic core member 44 are fitted with recess 10p of circuit board 10. Side leg 43f of third magnetic core member 43 and side leg 44f of fourth magnetic core member 44 are fitted with opening 10q of circuit board 10. Central leg 43g of third magnetic core member 43 and central leg 44g of fourth magnetic core member 44 are fitted with opening 10r of circuit board 10.

Third magnetic core member 43 and fourth magnetic core member 44 are both thermally connected to first portion 9a (first support surface 9d) of housing 9. Specifically, eleventh surface 43a of third magnetic core member 43 and twelfth surface 44a of fourth magnetic core member 44 may be in direct contact with first portion 9a (first support surface 9d). An electrically insulating heat-transfer layer (not shown) may be interposed between eleventh surface 43a of third magnetic core member 43 and first portion 9a (first support surface 9d) and between twelfth surface 44a of fourth magnetic core member 44 and first portion 9a (first support surface 9d).

Each of third magnetic core member 43 and fourth magnetic core member 44 has a smaller size than a corresponding one of first magnetic core member 13 and second magnetic core member 14 in the direction (x direction) in which eleventh surface 43a and thirteenth surface 43b are spaced away from each other. Third magnetic core member 43 and fourth magnetic core member 44 are both spaced away from second portion 9b (second support surface 9e).

First pressing portion 16 presses first portion 9a toward third magnetic core member 43 and fourth magnetic core member 44 to thermally connect first portion 9a to third magnetic core member 43 and fourth magnetic core member 44 more reliably. First portion 9a may be pressed by first pressing portion 16 to be in contact with third magnetic core member 43 and fourth magnetic core member 44.

First heat dissipation member 17 is thermally connected to third magnetic core member 43. First heat dissipation member 17 may be in direct contact with third magnetic core member 43. An electrically insulating heat-transfer layer (not shown) may be interposed between first heat dissipation member 17 and first magnetic core member 13. First heat dissipation member 17 is spaced away from first portion 9a. First heat dissipation member 17 is spaced away from second portion 9b. Base portion 17a of first heat dissipation member 17 is opposed to sixteenth surface 43d of third magnetic core member 43. Base portion 17a of first heat dissipation member 17 is thermally connected to sixteenth surface 43d of third magnetic core member 43.

Second heat dissipation member 18 is thermally connected to fourth magnetic core member 44. Second heat dissipation member 18 may be in direct contact with fourth magnetic core member 44. An electrically insulating heat-transfer layer (not shown) may be interposed between second heat dissipation member 18 and fourth magnetic core member 44. Second heat dissipation member 18 is spaced away from first portion 9a. Second heat dissipation member 18 is spaced away from second portion 9b. Base portion 18a of second heat dissipation member 18 is opposed to eighteenth surface 44d of fourth magnetic core member 44. Base portion 18a of second heat dissipation member 18 is thermally connected to eighteenth surface 44d of fourth magnetic core member 44.

The first coupling member (22a, 22b, 23a, 23b) further couples third magnetic core member 43, circuit board 10, and fourth magnetic core member 44 to each other. First magnetic core member 13, third magnetic core member 43, circuit board 10, second magnetic core member 14, and fourth magnetic core member 44 are integrated by the first coupling member (22a, 22b, 23a, 23b) to form an assembly unit. Particularly, the first coupling member (22a, 22b, 23a, 23b) couples first heat dissipation member 17, first magnetic core member 13, third magnetic core member 43, circuit board 10, second magnetic core member 14, fourth magnetic core member 44, and second heat dissipation member 18 to each other. First heat dissipation member 17, first magnetic core member 13, third magnetic core member 43, circuit board 10, second magnetic core member 14, fourth magnetic core member 44, and second heat dissipation member 18 are integrated by the first coupling member (22a, 22b, 23a, 23b) to form an assembly unit.

An example method of manufacturing power converter 1b of the present embodiment will be described with reference to FIGS. 9, 10, and 17 to 21. The example method of manufacturing power converter 1b of the present embodiment includes the following steps similar to those of the example method of manufacturing power converter 1 of Embodiment 1.

Figure 19:
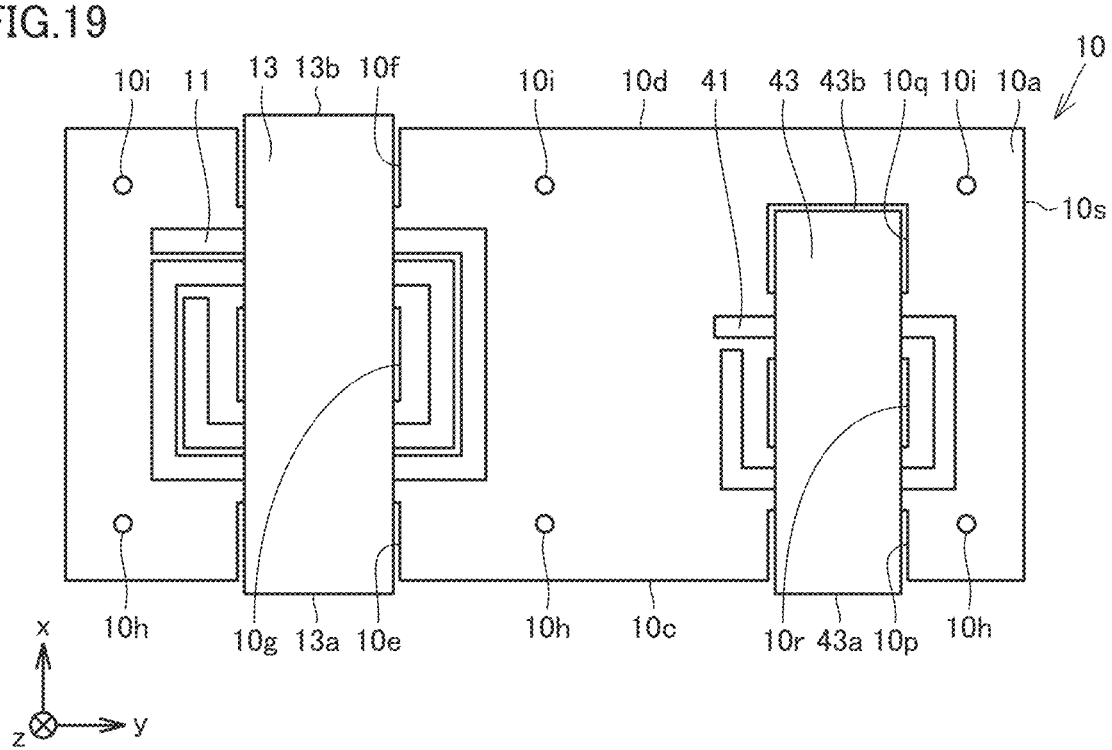
FIG. 19 is a schematic front view of the circuit board, the first magnetic core, and the second magnetic core included in the power converter of Embodiment 2.

As shown in FIGS. 17 and 19, the method of manufacturing power converter 1b of the present embodiment includes mounting first magnetic core 8a and second magnetic core 8b on circuit board 10. Specifically, first magnetic core member 13 and second magnetic core member 14 are stacked on each other to form first magnetic core 8a. Third magnetic core member 43 and fourth magnetic core member 44 are stacked on each other to form second magnetic core 8b. The pair of side legs and the central leg of first magnetic core 8a are fitted with recesses 10e, 10f and opening 10g of circuit board 10. The pair of side legs and the central leg of second magnetic core 8b are fitted with recess 10p and openings 10q, 10r of circuit board 10.

Figure 20:
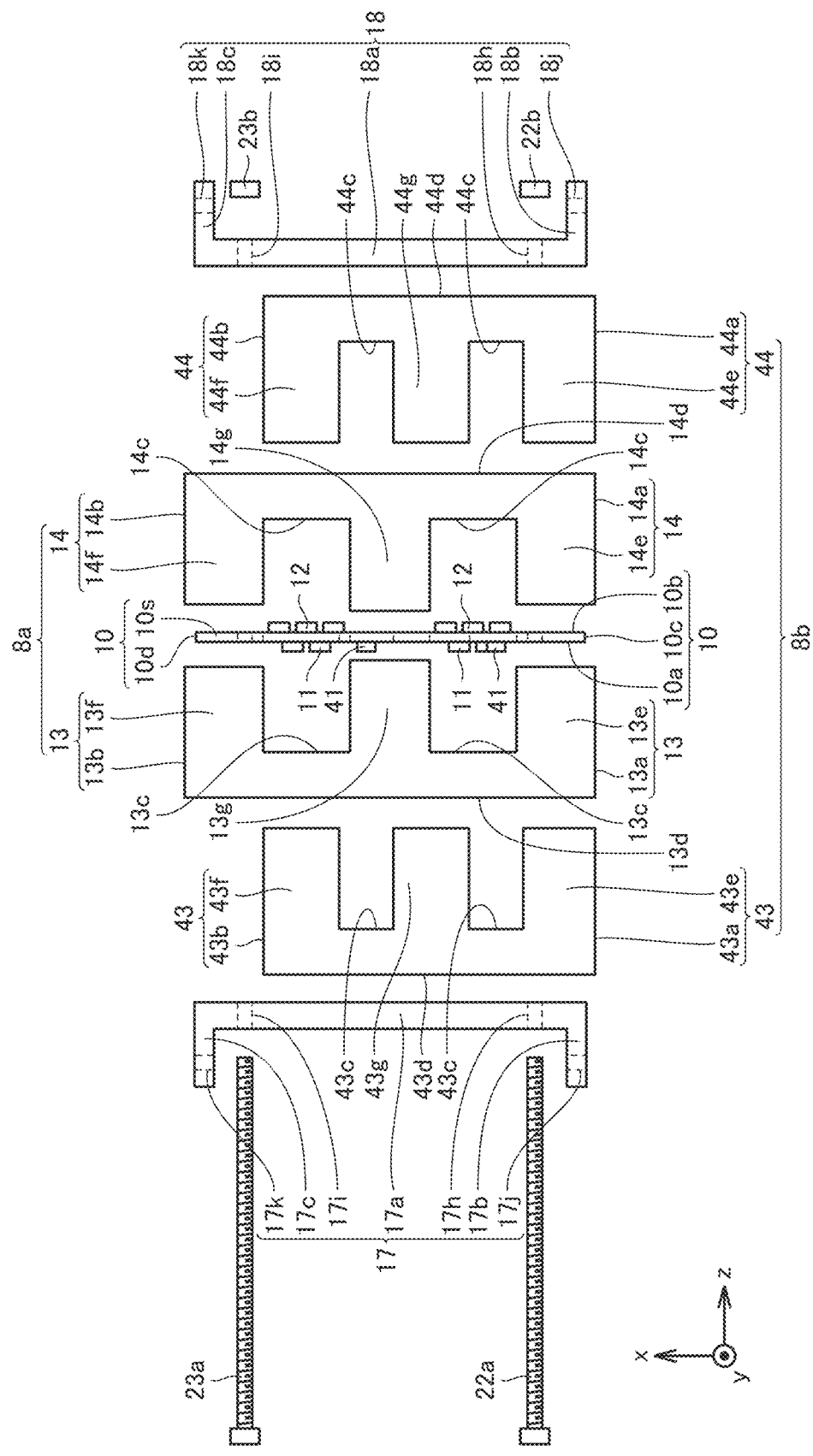
FIG. 20 is a schematic exploded side view of the power converter (excluding a first fastening member and a second fastening member) according to Embodiment 2.

As shown in FIG. 20, the method of manufacturing power converter 1b of the present embodiment includes forming the assembly unit including first magnetic core member 13, third magnetic core member 43, circuit board 10, second magnetic core member 14, and fourth magnetic core member 44 using the first coupling member (22a, 22b, 23a, 23b). Specifically, bolt 22a is passed through hole 10h of circuit board 10. Bolt 23a is passed through hole 10i of circuit board 10. Nut 22b is fastened to bolt 22a. Nut 23b is fastened to bolt 23a. Thus, first magnetic core member 13, third magnetic core member 43, circuit board 10, second magnetic core member 14, and fourth magnetic core member 44 are integrated by the first coupling member (22a, 22b, 23a, 23b). The assembly unit including first magnetic core member 13, third magnetic core member 43, circuit board 10, second magnetic core member 14, and fourth magnetic core member 44 is formed.

Particularly, the method of manufacturing power converter 1b of the present embodiment includes forming the assembly unit including first heat dissipation member 17, first magnetic core member 13, third magnetic core member 43, circuit board 10, second magnetic core member 14, fourth magnetic core member 44, and second heat dissipation member 18 using the first coupling member (22a, 22b, 23a, 23b). Specifically, base portion 17a of first heat dissipation member 17 is opposed to sixth surface 13d of first magnetic core member 13 and sixteenth surface 43d of third magnetic core member 43. Base portion 18a of second heat dissipation member 18 is opposed to eighth surface 14d of second magnetic core member 14 and eighteenth surface 44d of fourth magnetic core member 44. Bolt 22a is passed through hole 17h of first heat dissipation member 17, hole 10h of circuit board 10, and hole 18h of second heat dissipation member 18. Bolt 23a is passed through hole 17i of first heat dissipation member 17, hole 10i of circuit board 10, and hole 18i of second heat dissipation member 18. Nut 22b is fastened to bolt 22a. Nut 23b is fastened to bolt 23a.

Thus, first heat dissipation member 17, first magnetic core member 13, third magnetic core member 43, circuit board 10, second magnetic core member 14, fourth magnetic core member 44, and second heat dissipation member 18 are integrated by the first coupling member (22a, 22b, 23a, 23b). The assembly unit including first heat dissipation member 17, first magnetic core member 13, third magnetic core member 43, circuit board 10, second magnetic core member 14, fourth magnetic core member 44, and second heat dissipation member 18 is formed.

Figure 21:
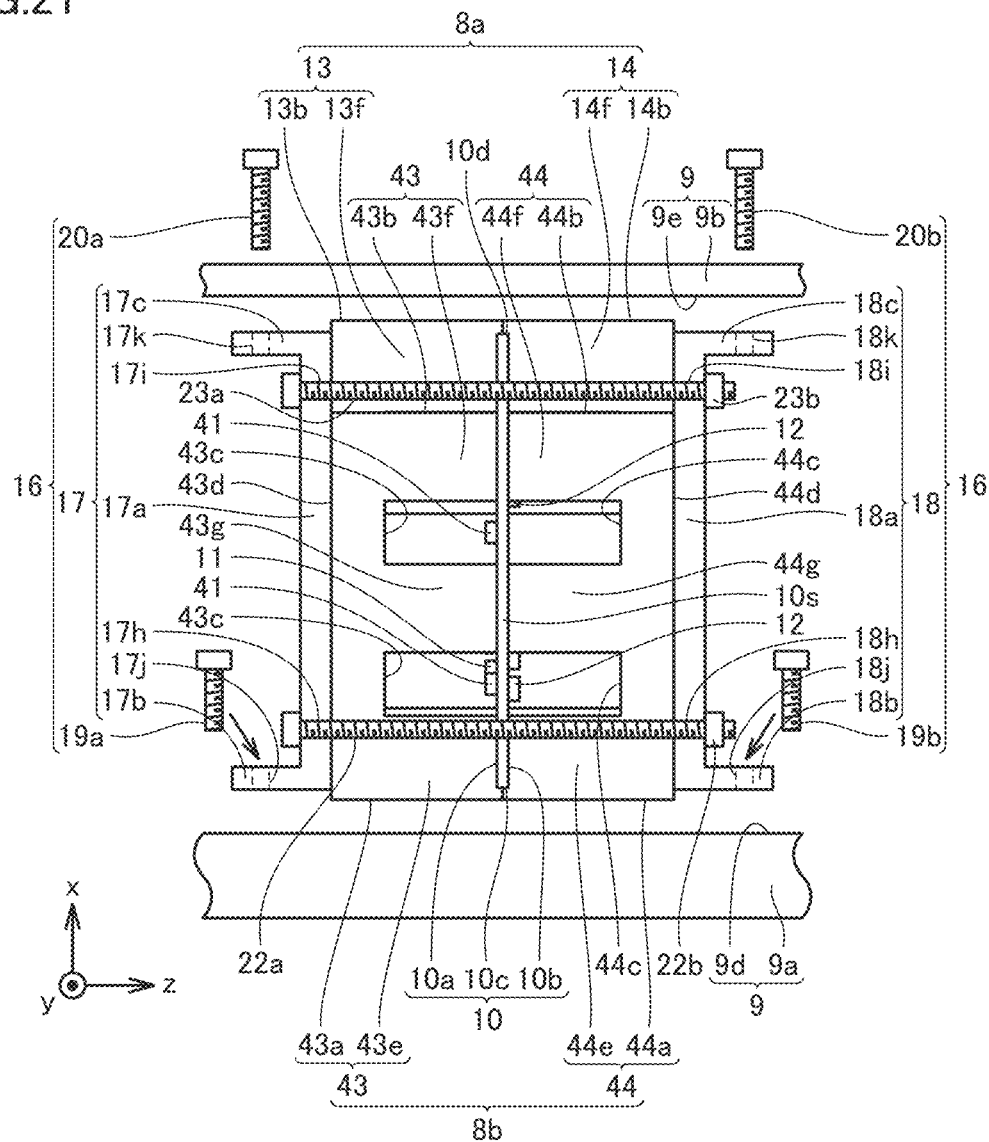
FIG. 21 is a schematic exploded side view of the power converter according to Embodiment 2.

As shown in FIG. 21, the method of manufacturing power converter 1b of the present embodiment includes fixing the assembly unit to housing 9. Specifically, the assembly unit is fixed to first portion 9a of housing 9 using first fastening members 19a, 19b. Flange 17b of first heat dissipation member 17 is fixed to first portion 9a using first fastening member 19a. Flange 18b of second heat dissipation member 18 is fixed to first portion 9a using first fastening member 19b. The assembly unit is fixed to second portion 9b of housing 9 using second fastening members 20a, 20b. Flange 17c of first heat dissipation member 17 is fixed to second portion 9b using second fastening member 20a. Flange 18c of second heat dissipation member 18 is fixed to second portion 9b using second fastening member 20b.

In the first direction (x direction), first surface 13a of first magnetic core member 13, second surface 14a of second magnetic core member 14, eleventh surface 43a of third magnetic core member 43, and twelfth surface 44a of fourth magnetic core member 44 are closer to first portion 9a of housing 9 than first heat dissipation member 17, second heat dissipation member 18, and first side surface 10c of circuit board 10 are to first portion 9a. First heat dissipation member 17 (flange 17b), first side surface 10c of circuit board 10, and second heat dissipation member 18 (flange 18b) are spaced away from first portion 9a (first support surface 9d) of housing 9. This allows first magnetic core member 13, second magnetic core member 14, third magnetic core member 43, and fourth magnetic core member 44 to be pressed toward first portion 9a using first fastening member 19a with no mechanical interference between first heat dissipation member 17 (flange 17b) and first portion 9a, between circuit board 10 and first portion 9a, and between second heat dissipation member 18 (flange 18b) and first portion 9a.

First heat dissipation member 17, first magnetic core member 13, third magnetic core member 43, circuit board 10, second magnetic core member 14, fourth magnetic core member 44, and second heat dissipation member 18 form the assembly unit using the first coupling member (22a, 22b, 23a, 23b). This facilitates the operation of fixing first heat dissipation member 17, first magnetic core member 13, third magnetic core member 43, circuit board 10, second magnetic core member 14, fourth magnetic core member 44, and second heat dissipation member 18 to first portion 9a of housing 9. The operation of pressing first magnetic core member 13, second magnetic core member 14, third magnetic core member 43, and fourth magnetic core member 44 toward first portion 9a is facilitated.

As shown in FIG. 9, the method of manufacturing power converter 1b of the present embodiment includes fixing second portion 9b of housing 9 to first portion 9a of housing 9 using fixing member 30. Thus, power converter 1b shown in FIG. 16 is obtained.

In one variation of the present embodiment, second magnetic core 8b may include at least one of nonmagnetic spacers 15a, 15b, 15c (see FIGS. 2, 14, and 15) as in Embodiment 1. Second magnetic core 8b is not limited to an EE magnetic core and may be, for example, an EI core.

Power converter 1b of the present embodiment achieves the following effects in addition to the effects of power converter 1 of Embodiment 1.

Power converter 1b of the present embodiment further includes second magnetic core 8b including third magnetic core member 43 and fourth magnetic core member 44. Third magnetic core member 43 includes eleventh surface 43a opposed to first portion 9a and thirteenth surface 43b opposite to eleventh surface 43a. The fourth magnetic core member includes twelfth surface 44a opposed to the first portion and fourteenth surface 44b opposite to twelfth surface 44a. Each of third magnetic core member 43 and fourth magnetic core member 44 has a smaller size than a corresponding one of first magnetic core member 13 and second magnetic core member 14 in the direction (x direction) in which eleventh surface 43a and thirteenth surface 43b are spaced from each other. Circuit board 10 further includes second coil conductor 41. Second coil conductor 41 is provided on at least one of first main surface 10a or second main surface 10b. Second coil conductor 41 extends to surround a part of second magnetic core 8b. Third magnetic core member 43 and fourth magnetic core member 44 are both thermally connected to first portion 9a.

Thus, third magnetic core member 43 and fourth magnetic core member 44 are cooled by first portion 9a of housing 9. The maximum temperature of second magnetic core 8b during operation of power converter 1b can be reduced. A loss in second magnetic core 8b can be reduced. The power conversion efficiency of power converter 1b can be improved. An output of power converter 1b can be increased.

In power converter 1b of the present embodiment, third magnetic core member 43 and fourth magnetic core member 44 are both pressed by first pressing portion 16 toward first portion 9a to be thermally connected to first portion 9a. Thus, first magnetic core member 13, second magnetic core member 14, third magnetic core member 43, and fourth magnetic core member 44 are thermally connected to first portion 9a of housing 9 more reliably. This facilitates heat dissipation from first magnetic core member 13 to first portion 9a of housing 9, heat dissipation from second magnetic core member 14 to first portion 9a of housing 9, heat dissipation from third magnetic core member 43 to first portion 9a of housing 9, and heat dissipation from fourth magnetic core member 44 to first portion 9a of housing 9. The maximum temperature of each of first magnetic core 8a and second magnetic core 8b during operation of power converter 1 can be lowered. A loss in each of first magnetic core 8a and second magnetic core 8b can be reduced. The power conversion efficiency of power converter 1b can be improved.

In power converter 1b of the present embodiment, eleventh surface 43a and twelfth surface 44a are closer to first portion 9a than first side surface 10c of circuit board 10 is to first portion 9a. This allows first magnetic core member 13, second magnetic core member 14, third magnetic core member 43, and fourth magnetic core member 44 to be cooled by first portion 9a of housing 9 with no mechanical interference between circuit board 10 and first portion 9a. The maximum temperature of each of first magnetic core 8a and second magnetic core 8b during operation of power converter 1b can be lowered. A loss in each of first magnetic core 8a and second magnetic core 8b can be reduced. The power conversion efficiency of power converter 1b can be improved.

Embodiment 3

A power converter 1c according to Embodiment 3 will be described with reference to FIGS. 22 to 24. Power converter 1c of the present embodiment is similar in configuration to power converter 1b of Embodiment 2 and is different mainly in the following respects.

Power converter 1c further includes a second pressing portion 46 and a second coupling member (52a, 52b, 53a, 53b). Second pressing portion 46 presses second magnetic core 8b toward first portion 9a to thermally connect third magnetic core member 43 and fourth magnetic core member 44 to first portion 9a more reliably. Third magnetic core member 43 and fourth magnetic core member 44 may be pressed by second pressing portion 46 to be in contact with first portion 9a.

Particularly, second pressing portion 46 includes a third heat dissipation member 47, a fourth heat dissipation member 48, and third fastening members 49a, 49b. Second pressing portion 46 is similar in configuration to first pressing portion 16 and is different from first pressing portion 16 mainly in the following two configurations. First, each of third heat dissipation member 47 and fourth heat dissipation member 48 has a smaller size than a corresponding one of first heat dissipation member 17 and second heat dissipation member 18 in the direction (x direction) in which eleventh surface 43a and thirteenth surface 43b are spaced away from each other. Second, second pressing portion 46 does not include second fastening members 20a, 20b, and third heat dissipation member 47 and fourth heat dissipation member 48 are not fastened to second portion 9b of housing 9.

Specifically, third heat dissipation member 47 is thermally connected to third magnetic core member 43. Third heat dissipation member 47 may be in direct contact with third magnetic core member 43. An electrically insulating heat-transfer layer (not shown) may be interposed between third heat dissipation member 47 and third magnetic core member 43. Third heat dissipation member 47 is spaced away from first portion 9a. Third heat dissipation member 47 is spaced away from second portion 9b.

Figure 22:
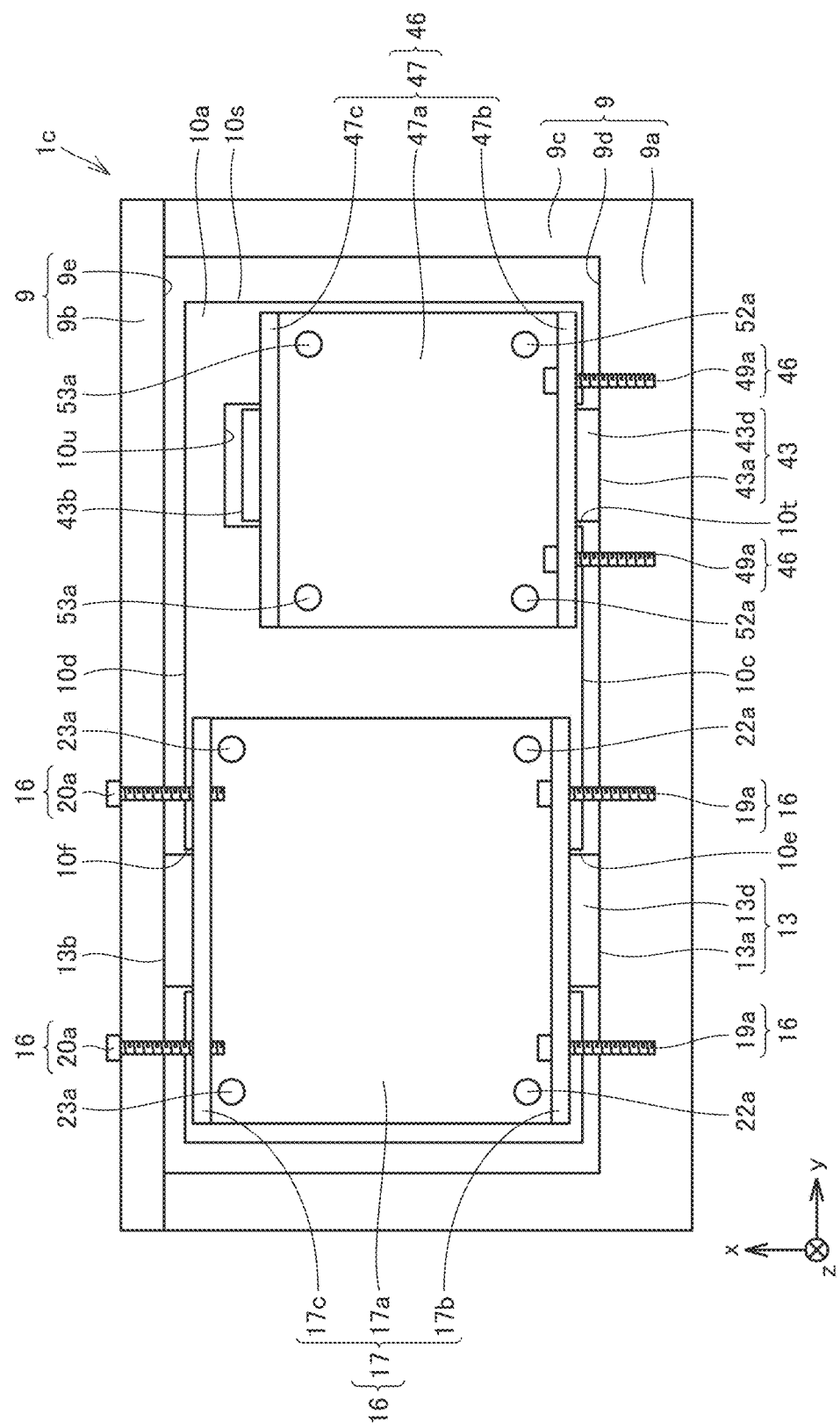
FIG. 22 is a schematic front view of an interior of a housing of the power converter of Embodiment 3.

As shown in FIG. 22, third heat dissipation member 47 includes a base portion 47a and a pair of flanges 47b, 47c. Base portion 47a extends in the first direction (x direction) and the second direction (y direction). Base portion 47a is opposed to sixteenth surface 43d of third magnetic core member 43. Base portion 47a is thermally connected to sixteenth surface 43d of third magnetic core member 43.

Flange 47b is provided at one end of base portion 47a which is proximate to first portion 9a (first support surface 9d). Flange 47b faces first portion 9a (first support surface 9d) and is spaced away from first portion 9a (first support surface 9d). Flange 47b extends from base portion 47a in the direction (−z direction) away from circuit board 10. Flange 47c is provided at the other end of base portion 47a which is proximate to second portion 9b (second support surface 9e). Flange 47c faces second portion 9b (second support surface 9e) and is spaced away from second portion 9b (second support surface 9e). Flange 47c extends from base portion 47a in the direction (−z direction) away from circuit board 10. Flanges 47b, 47c can function as radiating fins in third heat dissipation member 47.

Fourth heat dissipation member 48 is thermally connected to fourth magnetic core member 44. Fourth heat dissipation member 48 may be in direct contact with fourth magnetic core member 44. An electrically insulating heat-transfer layer (not shown) may be interposed between fourth heat dissipation member 48 and fourth magnetic core member 44. Fourth heat dissipation member 48 is spaced away from first portion 9a. Fourth heat dissipation member 48 is spaced away from second portion 9b.

Figure 23:
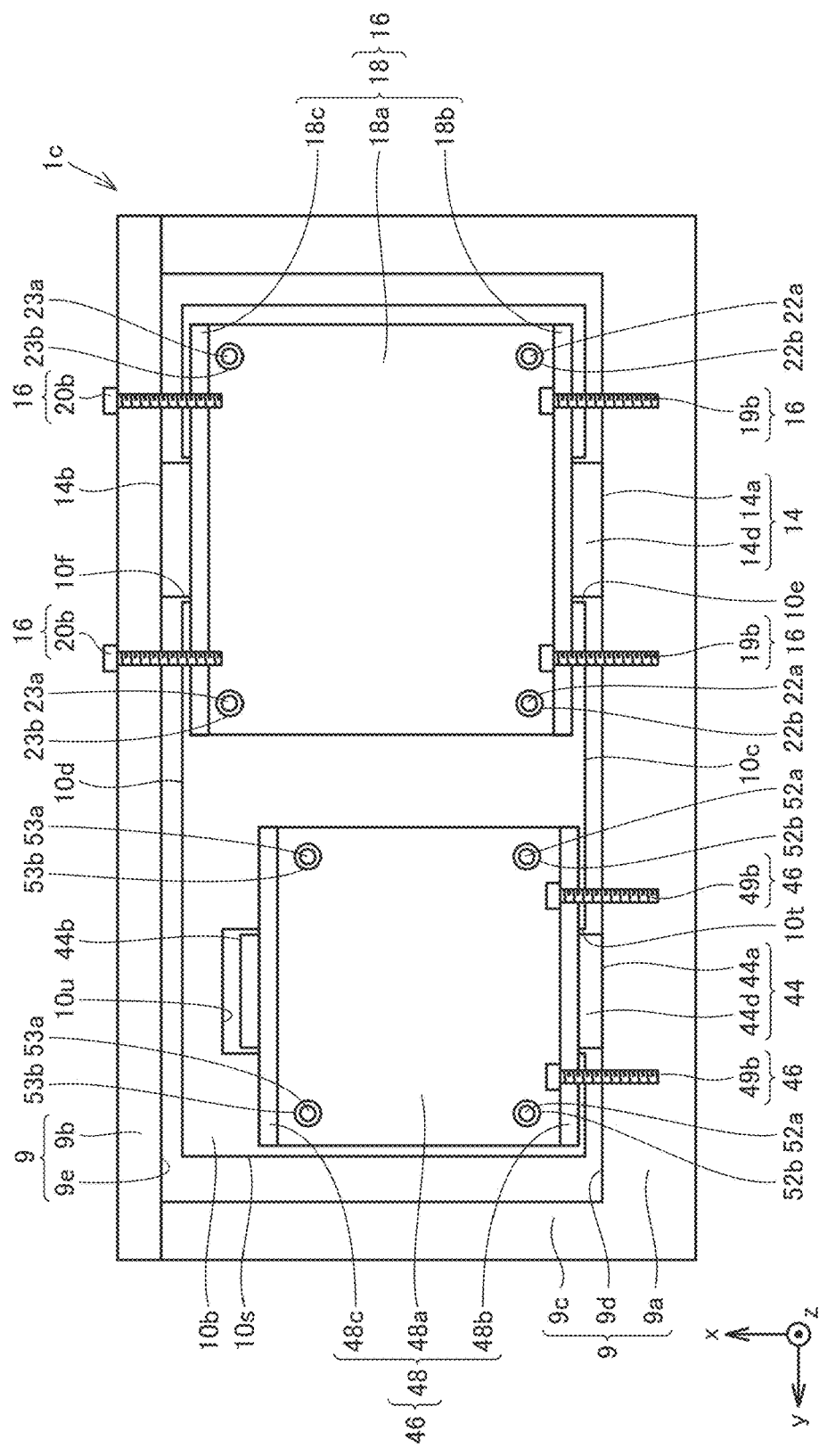
FIG. 23 is a schematic rear view of the interior of the housing of the power converter of Embodiment 3.

As shown in FIG. 23, fourth heat dissipation member 48 includes a base portion 48a and a pair of flanges 48b, 48c. Base portion 48a extends in the first direction (x direction) and the second direction (y direction). Base portion 48a is opposed to eighteenth surface 44d of fourth magnetic core member 44. Base portion 48a is thermally connected to eighteenth surface 44d of fourth magnetic core member 44.

Flange 48b is provided at one end of base portion 48a which is proximate to first portion 9a (first support surface 9d). Flange 48b faces first portion 9a (first support surface 9d) and is spaced away from first portion 9a (first support surface 9d). Flange 48b extends from base portion 48a in the direction (+z direction) away from circuit board 10. Flange 48c is provided at the other end of base portion 48a which is proximate to second portion 9b (second support surface 9e). Flange 48c faces second portion 9b (second support surface 9e) and is spaced away from second portion 9b (second support surface 9e). Flange 48c extends from base portion 48a in the direction (+z direction) away from circuit board 10. Flanges 48b, 48c can function as radiating fins in fourth heat dissipation member 48.

Third fastening members 49a, 49b fasten third heat dissipation member 47 and fourth heat dissipation member 48 to first portion 9a of housing 9. Specifically, third fastening member 49a fastens flange 47b of third heat dissipation member 47 to first portion 9a. Third fastening member 49a is fixed to first portion 9a through a hole (not shown) provided in flange 47b. Third fastening member 49b fastens flange 48b of fourth heat dissipation member 48 to first portion 9a. Third fastening member 49b is fixed to first portion 9a through a hole (not shown) provided in flange 48b. Third fastening members 49a, 49b are, for example, screws, bolts, or rivets.

The second coupling member (52a, 52b, 53a, 53b) couples third magnetic core member 43 to fourth magnetic core member 44. Third magnetic core member 43 and fourth magnetic core member 44 are integrated by the second coupling member (52a, 52b, 53a, 53b) to form an assembly unit. Particularly, the second coupling member (52a, 52b, 53a, 53b) couples third heat dissipation member 47, third magnetic core member 43, fourth magnetic core member 44, and fourth heat dissipation member 48 to each other. Third heat dissipation member 47, third magnetic core member 43, fourth magnetic core member 44, and fourth heat dissipation member 48 are integrated by the second coupling member (52a, 52b, 53a, 53b) to form an assembly unit.

The second coupling member (52a, 52b, 53a, 53b) may include, for example, bolts 52a, 53a and nuts 52b, 53b. Bolt 52a is fastened to nut 52b through a hole 10j of circuit board 10. Particularly, bolt 52a is fastened to nut 52b through a hole (not shown) provided in base portion 47a of third heat dissipation member 47, hole 10j of circuit board 10, and a hole (not shown) provided in base portion 48a of fourth heat dissipation member 48. Bolt 53a is fastened to nut 53b through a hole 10k of circuit board 10. Particularly, bolt 53a is fastened to nut 53b through a hole (not shown) provided in base portion 47a of third heat dissipation member 47, hole 10k of circuit board 10, and a hole (not shown) provided in base portion 48a of fourth heat dissipation member 48.

A relative position of second magnetic core 8b to circuit board 10 in the direction (x direction) in which eleventh surface 43a and thirteenth surface 43b are spaced away from each other is adjustable.

Figure 24:
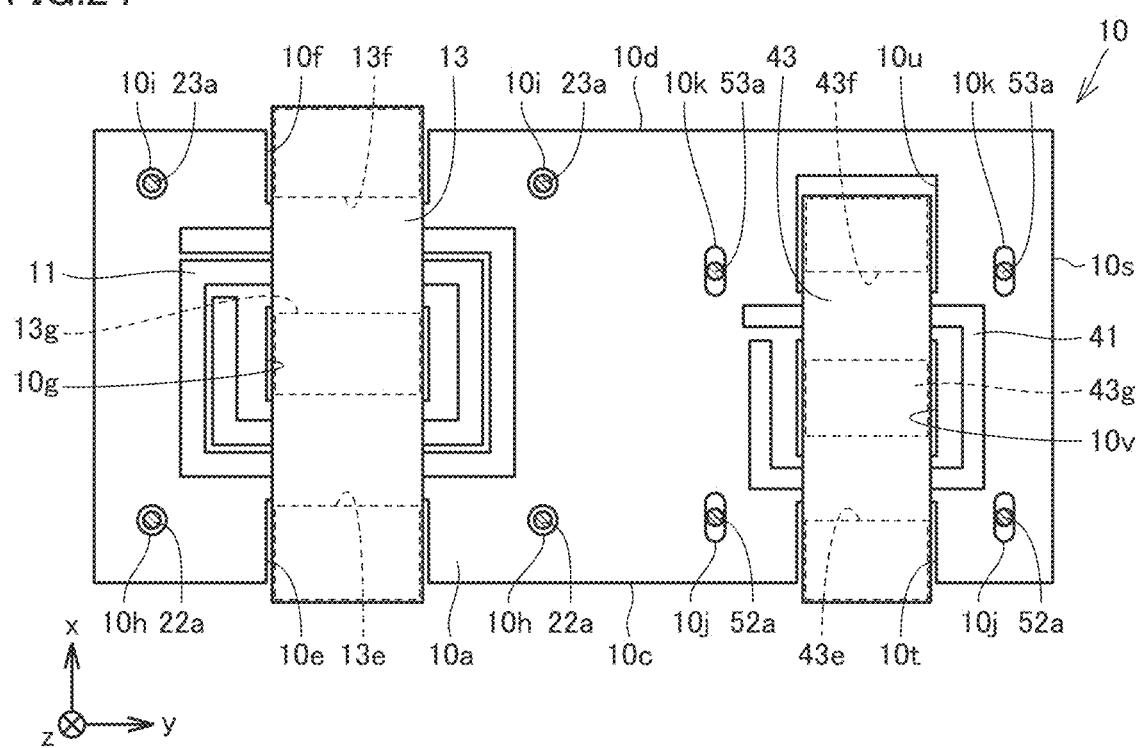
FIG. 24 is a schematic front view of a circuit board, a first magnetic core, and a second magnetic core included in the power converter of Embodiment 3.

Specifically, as shown in FIG. 24, hole 10j of circuit board 10 has a larger size than bolt 52a in the direction (x direction) in which eleventh surface 43a and thirteenth surface 43b are spaced away from each other. Hole 10j of circuit board 10 is, for example, an elongated hole extending in the direction (x direction) in which eleventh surface 43a and thirteenth surface 43b are spaced away from each other. For example, the size of hole 10j of circuit board 10 in the x direction is larger than the size of bolt 52a in the x direction by not less than a manufacturing error of second magnetic core 8b. In the direction (x direction) in which eleventh surface 43a and thirteenth surface 43b are spaced away from each other, hole 10k of circuit board 10 has a larger size than bolt 53a. Hole 10k of circuit board 10 is an elongated hole extending in the direction (x direction) in which eleventh surface 43a and thirteenth surface 43b are spaced away from each other. For example, the size of hole 10k of circuit board 10 in the x direction is larger than the size of bolt 53a in the x direction by not less than a manufacturing error of second magnetic core 8b.

A recess 10t is provided in first side surface 10c of insulating substrate 10s. An opening 10u and an opening 10v are provided in insulating substrate 10s. Side leg 43e of third magnetic core member 43 and side leg 44e of fourth magnetic core member 44 are inserted into recess 10t of circuit board 10. Side leg 43f of third magnetic core member 43 and side leg 44f of fourth magnetic core member 44 are inserted into opening 10u of circuit board 10. Central leg 43g of third magnetic core member 43 and central leg 44g of fourth magnetic core member 44 are inserted into opening 10v of circuit board 10.

Recess 10t is similar in structure to recess 10p of Embodiment 2 and has a larger size than recess 10p of Embodiment 2 in the direction (x direction) in which eleventh surface 43a and thirteenth surface 43b are spaced away from each other. For example, the size of recess 10t in the x direction is larger than the size of side leg 43e in the x direction by not less than a manufacturing error of second magnetic core 8b. Opening 10u is similar in structure to opening 10q of Embodiment 2 and has a larger size than opening 10q of Embodiment 2 in the direction (x direction) in which eleventh surface 43a and thirteenth surface 43b are spaced away from each other. For example, the size of opening 10u in the x direction is larger than the size of side leg 43f in the x direction by not less than a manufacturing error of second magnetic core 8b. Opening 10v is similar in structure to opening 10r of Embodiment 2 and has a larger size than opening 10r of Embodiment 2 in the direction (x direction) in which eleventh surface 43a and thirteenth surface 43b are spaced away from each other. For example, the size of opening 10v in the x direction is larger than the size of central leg 43g in the x direction by not less than a manufacturing error of second magnetic core 8b.

Holes 10j, 10k of circuit board 10, and recess 10t and openings 10u, 10v provided in circuit board 10 are formed to absorb a manufacturing error of second magnetic core 8b. The relative position of the assembly unit, which is integrated by the second coupling member (52a, 52b, 53a, 53b) and includes third magnetic core member 43 and fourth magnetic core member 44, to circuit board 10 is adjustable in the direction (x direction) in which eleventh surface 43a and thirteenth surface 43b are spaced away from each other. Even when the size of second magnetic core 8b varies due to a manufacturing error of second magnetic core 8b, third magnetic core member 43 and fourth magnetic core member 44 can be thermally connected to first portion 9a reliably using third fastening members 49a, 49b.

Power converter 1c of the present embodiment achieves the following effects in addition to the effects of power converter 1b of Embodiment 2.

Power converter 1c of the present embodiment further includes second magnetic core 8b and second pressing portion 46. Second magnetic core 8b includes third magnetic core member 43 and fourth magnetic core member 44. Circuit board 10 further includes second coil conductor 41. Second coil conductor 41 is provided on at least one of first main surface 10a or second main surface 10b. Second coil conductor 41 extends to surround a part of second magnetic core 8b. Third magnetic core member 43 includes eleventh surface 43a opposed to first portion 9a and thirteenth surface 43b opposite to eleventh surface 43a. Fourth magnetic core member 44 includes twelfth surface 44a opposed to first portion 9a and fourteenth surface 44b opposite to twelfth surface 44a. Each of third magnetic core member 43 and fourth magnetic core member 44 has a smaller size than a corresponding one of first magnetic core member 13 and second magnetic core member 14 in the direction (x direction) in which eleventh surface 43a and thirteenth surface 43b are spaced away from each other. The relative position of second magnetic core 8b to circuit board 10 in the direction (x direction) in which eleventh surface 43a and thirteenth surface 43b are spaced away from each other is adjustable. Second magnetic core 8b is pressed by second pressing portion 46 toward first portion 9a to thermally connect both of third magnetic core member 43 and fourth magnetic core member 44 to first portion 9a.

Even when the size of second magnetic core 8b varies due to a manufacturing error of second magnetic core 8b, thus, third magnetic core member 43 and fourth magnetic core member 44 can be thermally connected to first portion 9a reliably. The maximum temperature of second magnetic core 8b during operation of power converter 1c can be lowered. A loss in second magnetic core 8b can be reduced. The power conversion efficiency of power converter 1c can be improved. An output of power converter 1c can be increased.

In power converter 1c of the present embodiment, second pressing portion 46 includes third heat dissipation member 47, fourth heat dissipation member 48, and third fastening members 49a, 49b. Third heat dissipation member 47 is thermally connected to third magnetic core member 43 and is spaced away from first portion 9a. Fourth heat dissipation member 48 is thermally connected to fourth magnetic core member 44 and is spaced away from first portion 9a. Third fastening members 49a, 49b fasten third heat dissipation member 47 and fourth heat dissipation member 48 to first portion 9a.

Even when the size of second magnetic core 8b varies due to a manufacturing error of second magnetic core 8b, thus, third magnetic core member 43 and fourth magnetic core member 44 can be thermally connected to first portion 9a reliably. The maximum temperature of second magnetic core 8b during operation of power converter 1c can be lowered. A loss in second magnetic core 8b can be reduced. The power conversion efficiency of power converter 1c can be improved. An output of power converter 1c can be increased.

Further, third heat dissipation member 47 and fourth heat dissipation member 48 are spaced away from first portion 9a. This can allow third magnetic core member 43 and fourth magnetic core member 44 to be pressed toward first portion 9a with no mechanical interference between third heat dissipation member 47 (flange 47b) and first portion 9a, between circuit board 10 and first portion 9a, and between fourth heat dissipation member 48 (flange 48b) and first portion 9a. This facilitates heat dissipation from third magnetic core member 43 to first portion 9a of housing 9 and heat dissipation from fourth magnetic core member 44 to first portion 9a of housing 9. The maximum temperature of second magnetic core 8b during operation of power converter 1c can be lowered. A loss in second magnetic core 8b can be reduced. The power conversion efficiency of power converter 1c can be improved.

Embodiment 4

Figure 25:
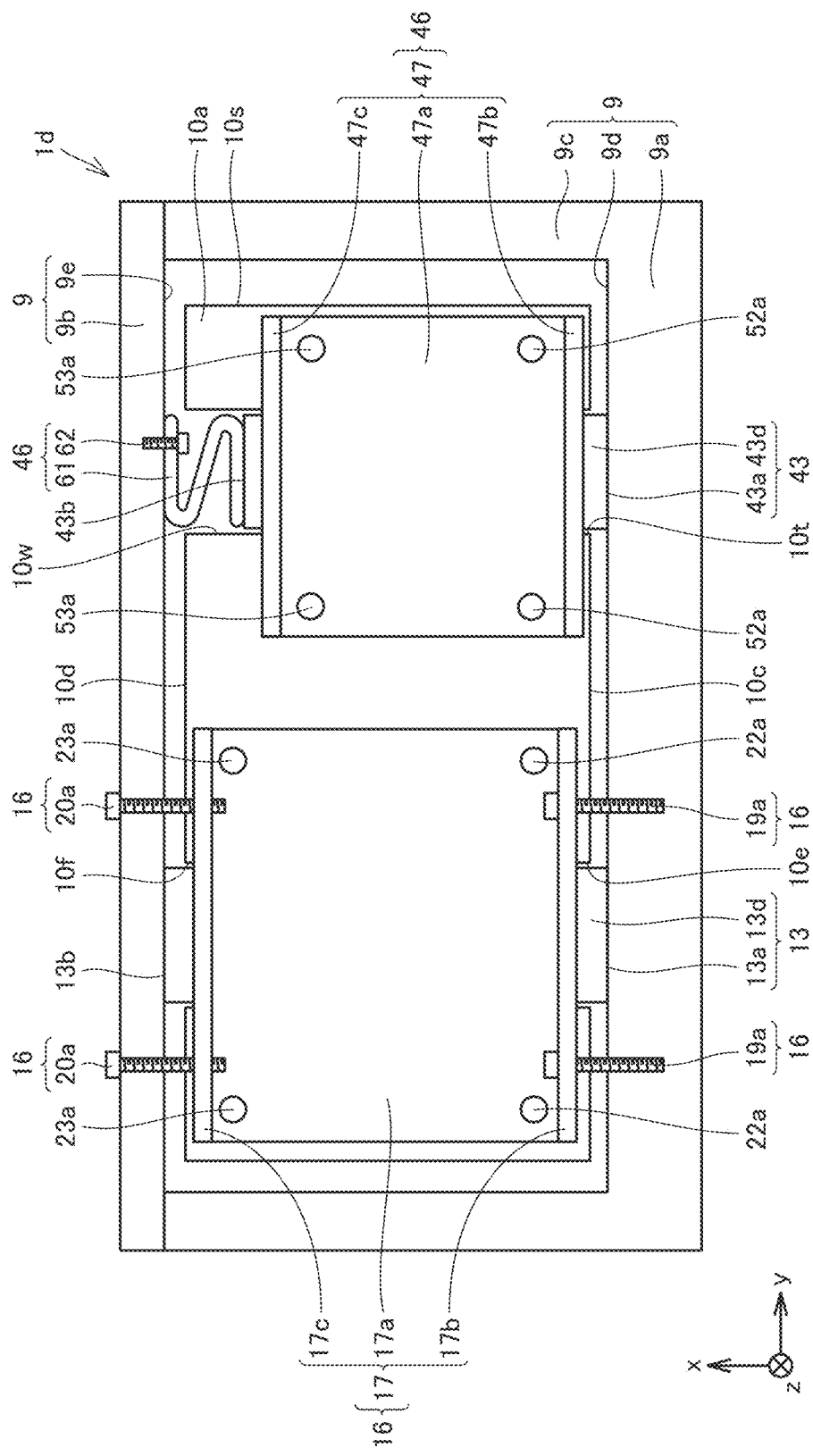
FIG. 25 is a schematic front view of an interior of a housing of the power converter of Embodiment 4.
Figure 26:
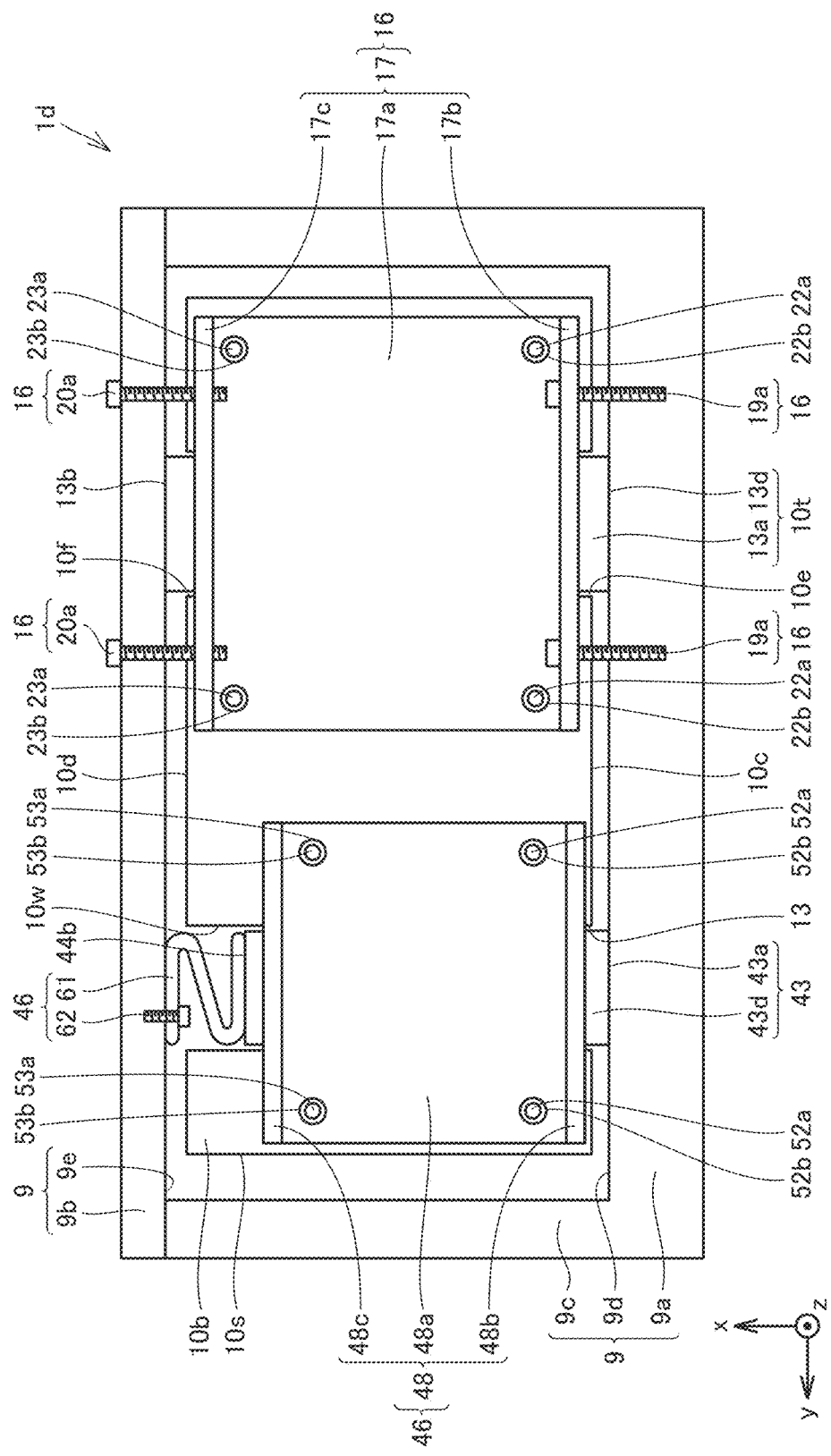
FIG. 26 is a schematic rear view of the interior of the housing of the power converter of Embodiment 4.
Figure 27:
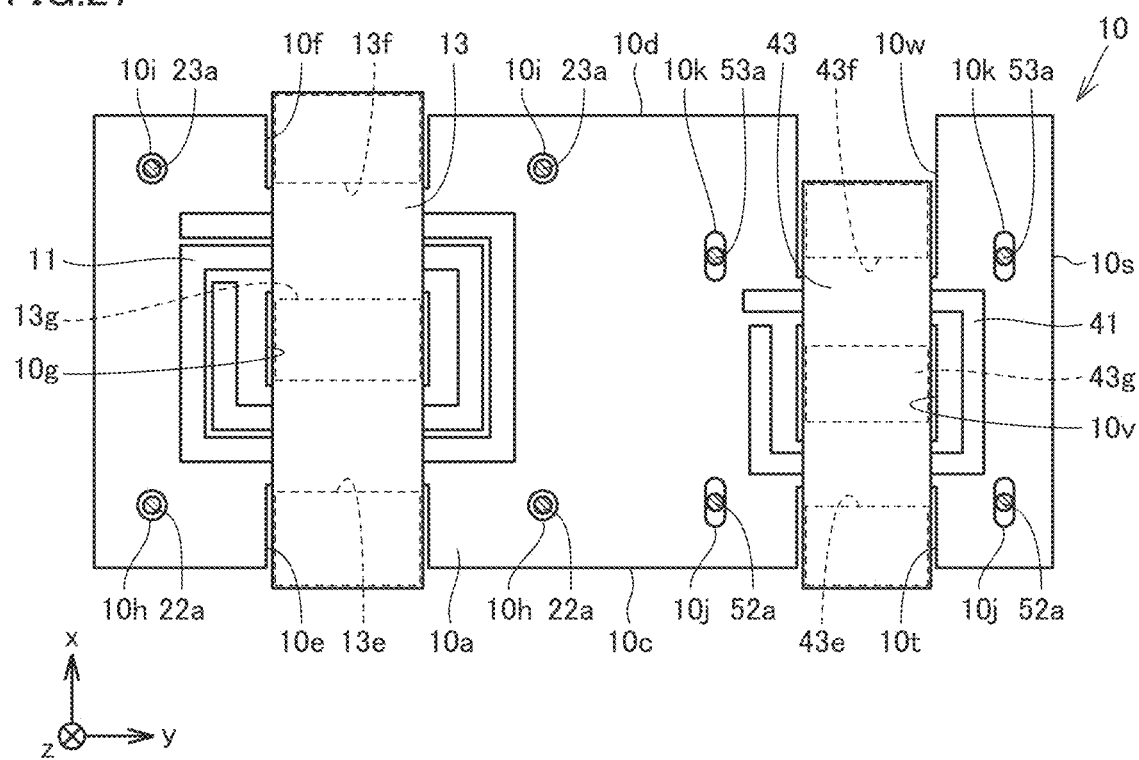
FIG. 27 is a schematic front view of a circuit board, a first magnetic core, and a second magnetic core included in the power converter of Embodiment 4.

A power converter 1d according to Embodiment 4 will be described with reference to FIGS. 25 to 27. Power converter 1d of the present embodiment is similar in configuration to power converter 1c of Embodiment 3 and is different mainly in the following respects.

In power converter 1d, a recess 10w extending to second side surface 10d of insulating substrate 10s is provided in circuit board 10, in place of opening 10u of Embodiment 3. Recess 10w is provided in second side surface 10d of insulating substrate 10s. Recess 10w extends from first main surface 10a to second main surface 10b through insulating substrate 10s. Side leg 43f of third magnetic core member 43 and side leg 44f of fourth magnetic core member 44 are inserted into recess 10w of circuit board 10.

Second pressing portion 46 includes a pressing member 61 and a fixing member 62 in place of third fastening members 49a, 49b of Embodiment 2. Pressing member 61 is disposed in recess 10w of circuit board 10. Pressing member 61 presses second magnetic core 8b toward first portion 9a. Pressing member 61 presses at least one of third magnetic core member 43 and fourth magnetic core member 44 toward first portion 9a. Particularly, pressing member 61 presses both of third magnetic core member 43 and fourth magnetic core member 44 toward first portion 9a. Pressing member 61 is fixed to second portion 9b (second support surface 9e) of housing 9 using fixing member 62. Fixing member 62 is, for example, a screw, a bolt, or a rivet.

Pressing member 61 is, for example, a spring. Particularly, pressing member 61 is a leaf spring made of a metallic material, such as iron, copper, or aluminum. A metallic spring can dissipate the heat generated in second magnetic core 8b to second portion 9b of housing 9, at a higher thermal conductivity. Heat dissipation from second magnetic core 8b to second portion 9b of housing 9 is facilitated. The maximum temperature of second magnetic core 8b during operation of power converter 1d can be lowered. A loss in second magnetic core 8b can be reduced. The power conversion efficiency of power converter 1d can be improved.

Holes 10j, 10k of circuit board 10, and recesses 10t, 10w and opening 10v provided in circuit board 10 are formed to absorb a manufacturing error of second magnetic core 8b. The relative position of the assembly unit, which is integrated by the second coupling member (52a, 52b, 53a, 53b) and includes third magnetic core member 43 and fourth magnetic core member 44, to circuit board 10 is adjustable in the direction (x direction) in which eleventh surface 43a and thirteenth surface 43b are spaced away from each other. Even when the size of second magnetic core 8b varies due to a manufacturing error of second magnetic core 8b, third magnetic core member 43 and fourth magnetic core member 44 can be thermally connected to first portion 9a reliably using pressing member 61.

Power converter 1d of the present embodiment achieves the effects similar to the effects of power converter 1c of Embodiment 3.

In power converter 1d of the present embodiment, second pressing portion 46 includes pressing member 61. Pressing member 61 presses second magnetic core 8b toward first portion 9a. Even when the size of second magnetic core 8b varies due to a manufacturing error of second magnetic core 8b, thus, third magnetic core member 43 and fourth magnetic core member 44 can be thermally connected to first portion 9a reliably. The maximum temperature of second magnetic core 8b during operation of power converter 1d can be lowered. A loss in second magnetic core 8b can be reduced. The power conversion efficiency of power converter 1d can be improved. An output of power converter 1d can be increased.

Embodiment 5

Figure 28:
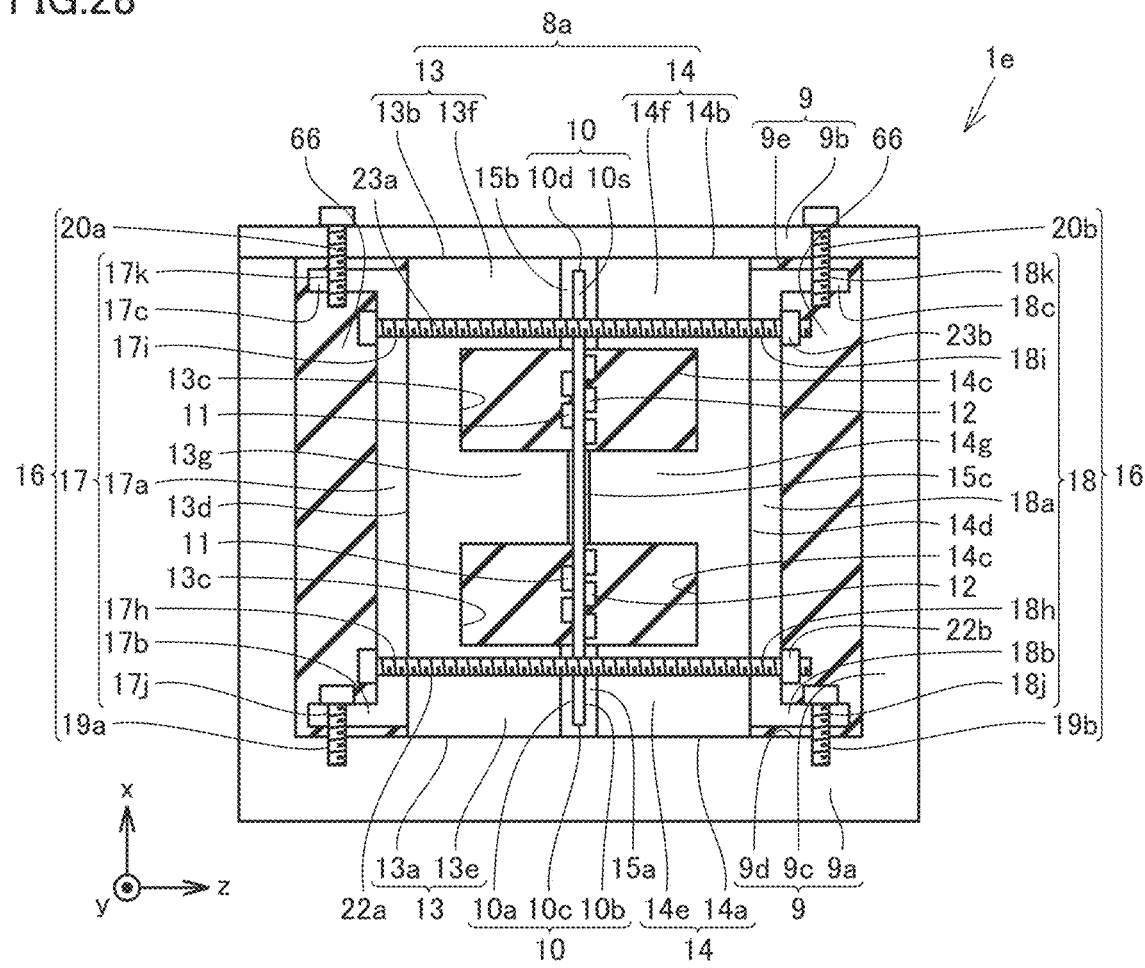
FIG. 28 is a schematic side view of an interior of a housing of the power converter of Embodiment 5.

A power converter 1e according to Embodiment 5 will be described with reference to FIG. 28. Power converter 1e of the present embodiment is similar in configuration to power converter 1 of Embodiment 1 and is different mainly in the following respects.

Power converter 1e further includes a thermally conductive resin member 66 that fills the interior space of housing 9. Thermally conductive resin member 66 means a resin material having a thermal conductivity of not less than 0.1 W/(m·K).

Thermally conductive resin member 66 is made of, for example, an epoxy resin or a silicon resin. The heat generated in first magnetic core 8a can be dissipated to housing 9 at a higher thermal conductivity through thermally conductive resin member 66, or through thermally conductive resin member 66, first heat dissipation member 17, and second heat dissipation member 18. The maximum temperature of first magnetic core 8a during operation of power converter 1e can be lowered. A loss in first magnetic core 8a can be reduced. The power conversion efficiency of power converter 1e can be improved.

In the variation of the present embodiment, thermally conductive resin member 66 may be used in any of power converters 1b, 1c, 1d of Embodiment 2 to Embodiment 4. In this variation, the heat generated in first magnetic core 8a and the heat generated in second magnetic core 8b can be dissipated to housing 9 at a higher thermal conductivity through thermally conductive resin member 66, or through thermally conductive resin member 66, first heat dissipation member 17, second heat dissipation member 18, third heat dissipation member 47, and fourth heat dissipation member 48. The maximum temperature of first magnetic core 8a and the maximum temperature of second magnetic core 8b during operation of the power converter of the variation can be lowered. A loss in each of first magnetic core 8a and second magnetic core 8b is reduced. The power conversion efficiency of the power converter of the variation can be improved.

It is to be understood that Embodiments 1 to 5 and the variations thereof disclosed herein are presented for the purpose of illustration and non-restrictive in every respect. At least two of Embodiments 1 to 5 disclosed herein may be combined as long as there is no inconsistency. It is therefore intended that the scope of the present invention is defined by claims, not only by the embodiments described above, and encompasses all modifications and variations equivalent in meaning and scope to the claims.

REFERENCE SIGNS LIST 1, 1b, 1c, 1d, 1e power converter; 3 switching element; 4 transformer; 4a primary coil conductor; 4b magnetic core; 4c secondary coil conductor; 5 diode; 6 smoothing reactor; 7 smoothing capacitor; 8a first magnetic core; 8b second magnetic core; 9 housing; 9a first portion; 9b second portion; 9c wall; 9d first support surface; 9e second support surface; 10 circuit board; 10a first main surface; 10b second main surface; 10c first side surface; 10d second side surface; 10e, 10f, 10p, 10t, 10w recess; 10g, 10q, 10r, 10u, 10v opening; 10h, 10i, 10j, 10k hole; 10s insulating substrate; 11, 12 coil conductor; 13 first magnetic core member; 13a first surface; 13b third surface; 13c fifth surface; 13d sixth surface; 13e, 13f side leg; 13g central leg; 14 second magnetic core member; 14a second surface; 14b fourth surface; 14c seventh surface; 14d eighth surface; 14e, 14f side leg; 14g central leg; 15a, 15b, 15c nonmagnetic spacer; 16 first pressing portion; 17 first heat dissipation member; 17a base portion; 17b, 17c flange; 17h, 17i, 17j, 17k hole; 18 second heat dissipation member; 18a base portion; 18b, 18c flange; 18h, 18i, 18j, 18k hole; 19a, 19b first fastening member; 20a, 20b second fastening member; 22a, 23a bolt; 22b, 23b nut; 30 fixing member; 31 fixing plate; 31a, 31b hole; 32, 33 screw; 41 second coil conductor; 43 third magnetic core member; 43a eleventh surface; 43b thirteenth surface; 43c fifteenth surface; 43d sixteenth surface; 43e, 43f side leg; 43g central leg; 44 fourth magnetic core member; 44a twelfth surface; 44b fourteenth surface; 44c seventeenth surface; 44d eighteenth surface; 44e, 44f side leg; 44g central leg; 46 second pressing portion; 47 third heat dissipation member; 47a base portion; 47b, 47c flange; 48 fourth heat dissipation member; 48a base portion; 48b, 48c flange;

49a, 49b third fastening member; 52a, 53a bolt; 52b, 53b nut; 61 pressing member; 62 fixing member; 66 thermally conductive resin member.

The invention claimed is:
1. A power converter comprising:
a circuit board including an insulating substrate and a first coil conductor, the insulating substrate including a first main surface, a second main surface opposite to the first main surface, a first side surface, and a second side surface opposite to the first side surface, the first side surface and the second side surface each connecting the first main surface to the second main surface, the first coil conductor being provided on at least one of the first main surface or the second main surface;
a first magnetic core including a first magnetic core member and a second magnetic core member;
a housing that accommodates the circuit board and the first magnetic core; and
a first pressing portion, wherein
the first coil conductor extends to surround a part of the first magnetic core,
the housing includes a first portion,
the first side surface is opposed to the first portion and is spaced away from the first portion,
the first magnetic core member and the second magnetic core member are both thermally connected to the first portion, and
the first portion is pressed by the first pressing portion toward the first magnetic core member and the second magnetic core member to be thermally connected to the first magnetic core member and the second magnetic core member.

2. The power converter according to claim 1, wherein
the first magnetic core member includes a first surface opposed to the first portion,
the second magnetic core member includes a second surface opposed to the first portion, and
the first surface and the second surface are closer to the first portion than the first side surface of the circuit board is to the first portion.

3. The power converter according to claim 1, wherein
the first pressing portion includes a first heat dissipation member, a second heat dissipation member, and a first fastening member,
the first heat dissipation member is thermally connected to the first magnetic core member and is spaced away from the first portion,
the second heat dissipation member is thermally connected to the second magnetic core member and is spaced away from the first portion, and
the first fastening member fastens the first heat dissipation member and the second heat dissipation member to the first portion.

4. The power converter according to claim 3, further comprising a coupling member coupling the first heat dissipation member, the first magnetic core member, the circuit board, the second magnetic core member, and the second heat dissipation member to each other.

5. The power converter according to claim 1 or 2, wherein
the housing further includes a second portion opposed to the first portion,
the second side surface is opposed to the second portion and is spaced away from the second portion, and
the first magnetic core member and the second magnetic core member are both further thermally connected to the second portion.

6. The power converter according to claim 5, wherein
the first magnetic core member includes a third surface opposed to the second portion,
the second magnetic core member includes a fourth surface opposed to the second portion, and
the third surface and the fourth surface are closer to the second portion than the second side surface of the circuit board is to the second portion.

7. The power converter according to claim 5, wherein the first portion has a higher thermal conductance than the second portion.

8. The power converter according to claim 7, wherein
the first portion and the second portion are made of a same material, and
the first portion has a larger thickness than the second portion.

9. The power converter according to claim 5, further comprising a first pressing portion, wherein
the first portion is pressed by the first pressing portion toward the first magnetic core member and the second magnetic core member to be thermally connected to the first magnetic core member and the second magnetic core member, and
the second portion is pressed by the first pressing portion toward the first magnetic core member and the second magnetic core member to be thermally connected to the first magnetic core member and the second magnetic core member.

10. The power converter according to claim 9, wherein
the first pressing portion includes a first heat dissipation member, a second heat dissipation member, a first fastening member, and a second fastening member,
the first heat dissipation member is thermally connected to the first magnetic core member and is spaced away from the first portion and the second portion,
the second heat dissipation member is thermally connected to the second magnetic core member and is spaced away from the first portion and the second portion,
the first fastening member fastens the first heat dissipation member and the second heat dissipation member to the first portion, and
the second fastening member fastens the first heat dissipation member and the second heat dissipation member to the second portion.

11. The power converter according to claim 1, further comprising a coupling member coupling the first magnetic core member, the circuit board, and the second magnetic core member to each other.

12. The power converter according to claim 1, further comprising a second magnetic core including a third magnetic core member and a fourth magnetic core member,
the third magnetic core member includes a fifth surface opposed to the first portion and a seventh surface opposite to the fifth surface,
the fourth magnetic core member includes a sixth surface opposed to the first portion and an eighth surface opposite to the sixth surface,
each of the third magnetic core member and the fourth magnetic core member has a smaller size than a corresponding one of the first magnetic core member and the second magnetic core member in a direction in which the fifth surface and the seventh surface are spaced away from each other,
the circuit board further includes a second coil conductor, the second coil conductor being provided on at least one of the first main surface or the second main surface, the second coil conductor extends to surround a part of the second magnetic core, and the third magnetic core member and the fourth magnetic core member are both pressed by the first pressing portion toward the first portion to be thermally connected to the first portion.

13. The power converter according to claim 1, further comprising a thermally conductive resin member that fills an interior space of the housing.

14. A power converter comprising:
a circuit board including an insulating substrate and a first coil conductor, the insulating substrate including a first main surface, a second main surface opposite to the first main surface, a first side surface, and a second side surface opposite to the first side surface, the first side surface and the second side surface each connecting the first main surface to the second main surface, the first coil conductor being provided on at least one of the first main surface or the second main surface;
a first magnetic core including a first magnetic core member and a second magnetic core member;
a second magnetic core including a third magnetic core member and a fourth magnetic core member; and
a housing that accommodates the circuit board, the first magnetic core and the second magnetic core, wherein
the first coil conductor extends to surround a part of the first magnetic core,
the housing includes a first portion,
the first side surface is opposed to the first portion and is spaced away from the first portion, and
the first magnetic core member and the second magnetic core member are both thermally connected to the first portion,
the third magnetic core member includes a fifth surface opposed to the first portion and a seventh surface opposite to the fifth surface,
the fourth magnetic core member includes a sixth surface opposed to the first portion and an eighth surface opposite to the sixth surface,
each of the third magnetic core member and the fourth magnetic core member has a smaller size than a corresponding one of the first magnetic core member and the second magnetic core member in a direction in which the fifth surface and the seventh surface are spaced away from each other,
the circuit board further includes a second coil conductor, the second coil conductor being provided on at least one of the first main surface or the second main surface,
the second coil conductor extends to surround a part of the second magnetic core, and
the third magnetic core member and the fourth magnetic core member are both thermally connected to the first portion.

15. The power converter according to claim 14, wherein the fifth surface and the sixth surface are closer to the first portion than the first side surface of the circuit board is to the first portion.

16. A power converter comprising:
a circuit board including an insulating substrate and a first coil conductor, the insulating substrate including a first main surface, a second main surface opposite to the first main surface, a first side surface, and a second side surface opposite to the first side surface, the first side surface and the second side surface each connecting the first main surface to the second main surface, the first coil conductor being provided on at least one of the first main surface or the second main surface;
a first magnetic core including a first magnetic core member and a second magnetic core member;
a second magnetic core including a third magnetic core member and a fourth magnetic core member;
a second pressing portion; and
a housing that accommodates the circuit board, the first magnetic core and the second magnetic core, wherein
the first coil conductor extends to surround a part of the first magnetic core,
the housing includes a first portion,
the first side surface is opposed to the first portion and is spaced away from the first portion, and
the first magnetic core member and the second magnetic core member are both thermally connected to the first portion,
the circuit board further includes a second coil conductor, the second coil conductor being provided on at least one of the first main surface or the second main surface,
the second coil conductor extends to surround a part of the second magnetic core,
the third magnetic core member includes a fifth surface opposed to the first portion and a seventh surface opposite to the fifth surface,
the fourth magnetic core member includes a sixth surface opposed to the first portion and an eighth surface opposite to the sixth surface,
each of the third magnetic core member and the fourth magnetic core member has a smaller size than a corresponding one of the first magnetic core member and the second magnetic core member in a direction in which the fifth surface and the seventh surface are spaced away from each other,
a relative position of the second magnetic core to the circuit board is adjustable in the direction, and
the second magnetic core is pressed by the second pressing portion toward the first portion to thermally connect both of the third magnetic core member and the fourth magnetic core member to the first portion.

17. The power converter according to claim 16, wherein the second pressing portion includes a third heat dissipation member, a fourth heat dissipation member, and a third fastening member,
the third heat dissipation member is thermally connected to the third magnetic core member and is spaced away from the first portion,
the fourth heat dissipation member is thermally connected to the fourth magnetic core member and is spaced away from the first portion, and
the third fastening member fastens the third heat dissipation member and the fourth heat dissipation member to the first portion.

18. The power converter according to claim 16, wherein the second pressing portion includes a pressing member, and
the pressing member presses the second magnetic core toward the first portion.

* * * * *